United States Patent
Park et al.

(10) Patent No.: US 11,177,215 B2
(45) Date of Patent: Nov. 16, 2021

(54) INTEGRATED CIRCUIT DEVICE

(71) Applicant: Samsung Electronics Co., Ltd., Suwon-si (KR)

(72) Inventors: Kyungwook Park, Pohang-si (KR); Yoongoo Kang, Hwaseong-si (KR); Wonseok Yoo, Seoul (KR); Dain Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/802,676

(22) Filed: Feb. 27, 2020

(65) Prior Publication Data

US 2021/0066200 A1 Mar. 4, 2021

(30) Foreign Application Priority Data

Aug. 29, 2019 (KR) .................. 10-2019-0106642

(51) Int. Cl.
*H01L 23/532* (2006.01)
*H01L 27/108* (2006.01)

(52) U.S. Cl.
CPC .. *H01L 23/53295* (2013.01); *H01L 27/10823* (2013.01); *H01L 27/10855* (2013.01); *H01L 27/10888* (2013.01)

(58) Field of Classification Search
CPC ......... H01L 21/10823; H01L 21/10855; H01L 21/10888; H01L 23/53295
See application file for complete search history.

(56) References Cited

U.S. PATENT DOCUMENTS

| | | | |
|---|---|---|---|
| 7,132,353 B1* | 11/2006 | Xia | H01L 21/3145 438/585 |
| 9,349,802 B2 | 5/2016 | Heo et al. | |
| 9,595,580 B2 | 3/2017 | Shin et al. | |
| 9,695,334 B2 | 7/2017 | Golden et al. | |
| 10,134,628 B2 | 11/2018 | Song et al. | |
| 2004/0058199 A1 | 3/2004 | Sakamoto et al. | |
| 2006/0003530 A1* | 1/2006 | Kim | H01L 21/76831 438/258 |
| 2015/0061134 A1* | 3/2015 | Lee | H01L 21/76895 257/751 |
| 2017/0033003 A1 | 2/2017 | Song et al. | |
| 2018/0301459 A1* | 10/2018 | Kim | B08B 7/0014 |
| 2018/0342521 A1* | 11/2018 | Son | H01L 21/76816 |
| 2019/0305218 A1* | 10/2019 | Trinh | H01L 45/144 |
| 2020/0052203 A1* | 2/2020 | Trinh | H01L 45/148 |

FOREIGN PATENT DOCUMENTS

| | | |
|---|---|---|
| CN | 107302012 A | 10/2017 |
| KR | 10-0801736 B1 | 2/2008 |
| KR | 10-2017-0014870 A | 2/2017 |

* cited by examiner

*Primary Examiner* — Zandra V Smith
*Assistant Examiner* — John M Parker
(74) *Attorney, Agent, or Firm* — Muir Patent Law, PLLC

(57) ABSTRACT

An integrated circuit device includes a conductive line formed on a substrate, an insulating spacer covering side walls of the conductive line and extending parallel with the conductive line, and a conductive plug that is spaced apart from the conductive line with the insulating spacer therebetween. The insulating spacer includes an insulating liner contacting the conductive line, an outer spacer contacting the conductive plug, and a barrier layer between the insulating liner and the outer spacer to prevent oxygen atoms from diffusing into the outer spacer.

20 Claims, 35 Drawing Sheets

INTEGRATED CIRCUIT DEVICE

CROSS-REFERENCE TO RELATED APPLICATION

This application claims priority under 35 U.S.C. § 119 to Korean Patent Application No. 10-2019-0106642, filed on Aug. 29, 2019, in the Korean Intellectual Property Office, the disclosure of which is incorporated herein in its entirety by reference.

BACKGROUND

The inventive concept relates to an integrated circuit device, and more particularly, to an integrated circuit device including a plurality of conductive patterns adjacent to each other and insulating spacers therebetween.

Recently, as integrated circuit devices have been rapidly scaled down, intervals among a plurality of wiring lines are reduced and accordingly, insulating spacers among the plurality of wiring lines are desirable to be thin. However, as an insulating spacer is thinned, an undesired mixed layer is formed on an interface between different layers that form the insulating spacer and accordingly, it is difficult to secure an insulating distance required by the insulating spacer. Therefore, it is necessary to develop an integrated circuit device having a structure capable of solving this problem.

SUMMARY

The inventive concept provides an integrated circuit device having a fine unit cell size as the integrated circuit device is scaled down and having a structure in which a stable insulation distance may be secured between adjacent conductive regions in the integrated circuit device.

According to an exemplary embodiment of the inventive concept, there is provided an integrated circuit device, including a conductive line formed on a substrate, an insulating spacer covering side walls of the conductive line and to extending to run parallel with the conductive line, and a conductive plug that is spaced apart from the conductive line with the insulating spacer therebetween. The insulating spacer includes an insulating liner contacting the conductive line, an outer spacer contacting the conductive plug, and a barrier layer interposed between the insulating liner and the outer spacer to prevent oxygen atoms from diffusing into the outer spacer.

According to an exemplary embodiment of the inventive concept, there is provided an integrated circuit device, including a line structure including a bit line formed on a substrate and an insulation capping pattern covering the bit line, an insulating spacer covering side walls of the line structure, a conductive plug spaced apart from the bit line in a first horizontal direction with the insulating spacer interposed, and a conductive landing pad vertically overlapping the conductive plug. The insulating spacer includes an insulating liner contacting the line structure, an outer spacer contacting the conductive plug and the conductive landing pad, and a barrier layer interposed between the insulating liner and the outer spacer to prevent oxygen atoms from diffusing into the outer spacer.

According to an aspect of the inventive concept, there is provided an integrated circuit device, including a line structure including a bit line formed on a substrate and an insulation capping pattern that covers the bit line, a pair of insulating spacers covering opposite side walls of the line structure respectively, and a pair of conductive plugs spaced apart from each other in a first horizontal direction with the line structure and the pair of insulating spacers therebetween. Each of the pair of insulating spacers includes an insulating liner contacting the bit line, an outer spacer contacting one of the pair of conductive plugs, an outer barrier layer interposed between the insulating liner and the outer spacer to prevent oxygen atoms from diffusing into the outer spacer, and an air spacer interposed between the insulating liner and the outer barrier layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
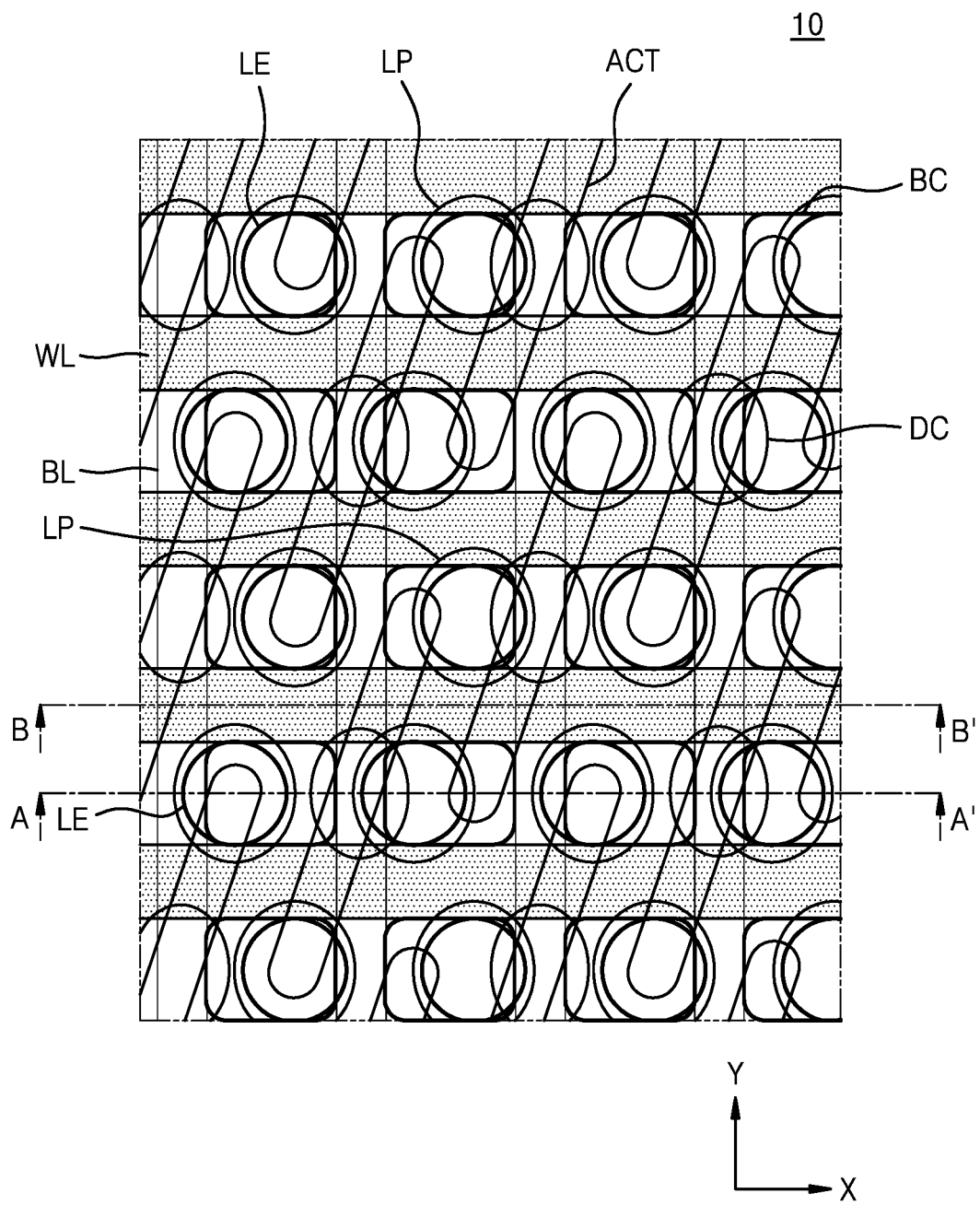
FIG. 1 is a schematic planar layout illustrating a memory cell array region of an integrated circuit device according to embodiments of the inventive concept.

Hereinafter, embodiments of the inventive concept will be described in detail with reference to the accompanying drawings. Like reference numerals refer to like elements throughout. Previously given description is omitted.

FIG. 1 is a schematic planar layout illustrating a memory cell array region of an integrated circuit device 10 according to embodiments of the inventive concept.

Referring to FIG. 1, the integrated circuit device 10 may include a plurality of active regions ACT arranged to horizontally extend in a diagonal direction with respect to a first horizontal direction (an X direction) and a second horizontal direction (a Y direction) on a plane. A plurality of word lines WL may extend in parallel in the first horizontal direction (the X direction) across the plurality of active regions ACT. Above the plurality of word lines WL, a plurality of bit lines BL may extend in parallel in the second horizontal direction (the Y direction) that is different from the first horizontal direction (the X direction). The plurality of bit lines BL may be respectively connected to the plurality of active regions ACT through a plurality of direct contacts DC.

Among the plurality of bit lines BL, between two adjacent bit lines BL, a plurality of buried contacts BC may be formed. On the plurality of buried contact BC, a plurality of conductive landing pads LP may be formed. At least parts of the plurality of conductive landing pads LP may be arranged to overlap the plurality of buried contacts BC, respectively. A plurality of lower electrodes LE may be formed on the plurality of conductive landing pads LP. The plurality of lower electrodes LE may be connected to the plurality of active regions ACT through the plurality of buried contacts BC and the plurality of conductive landing pads LP.

Figure 2A:
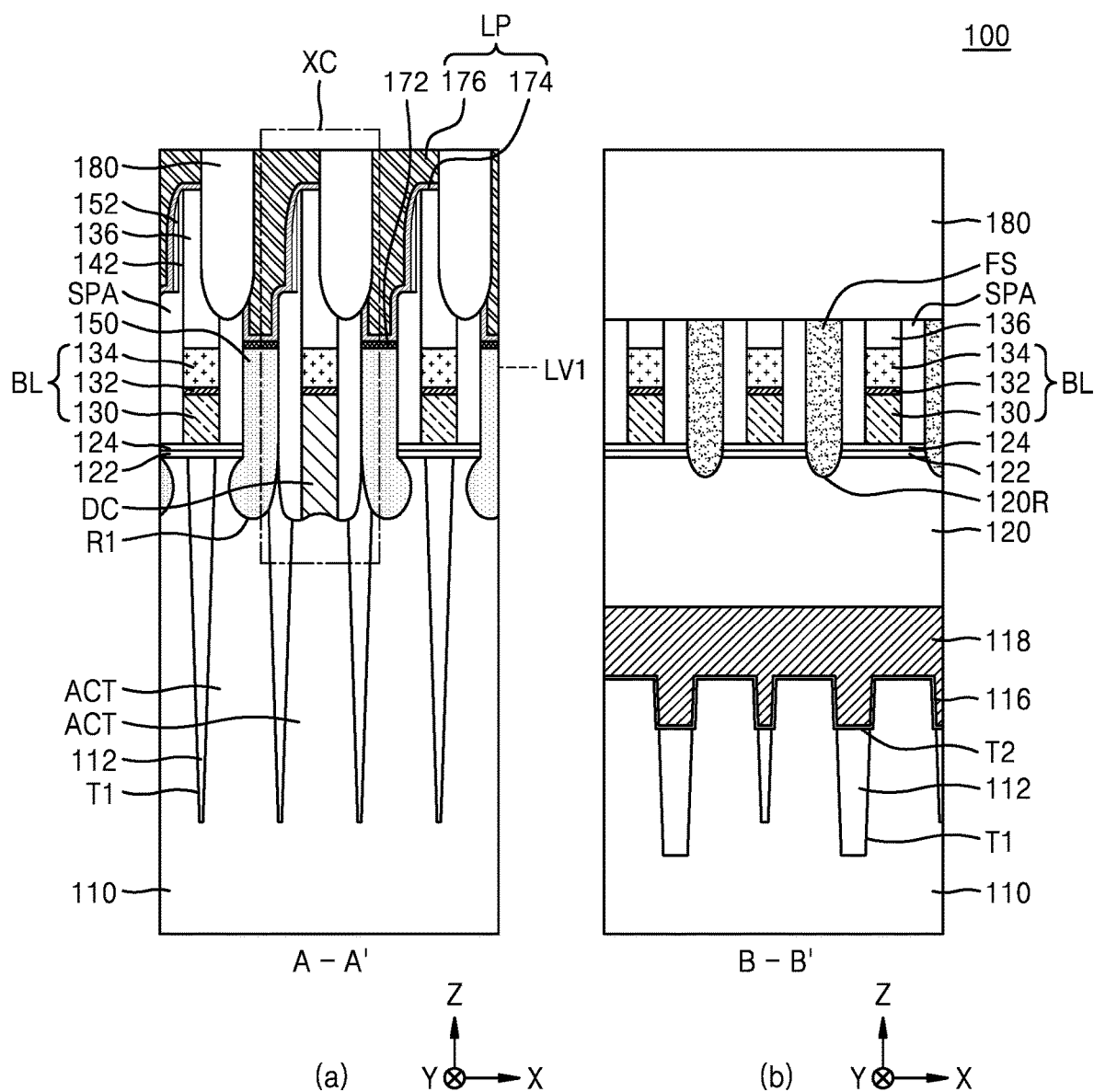
FIG. 2A is a cross-sectional view illustrating the integrated circuit device according to embodiments of the inventive concept.
Figure 2B:
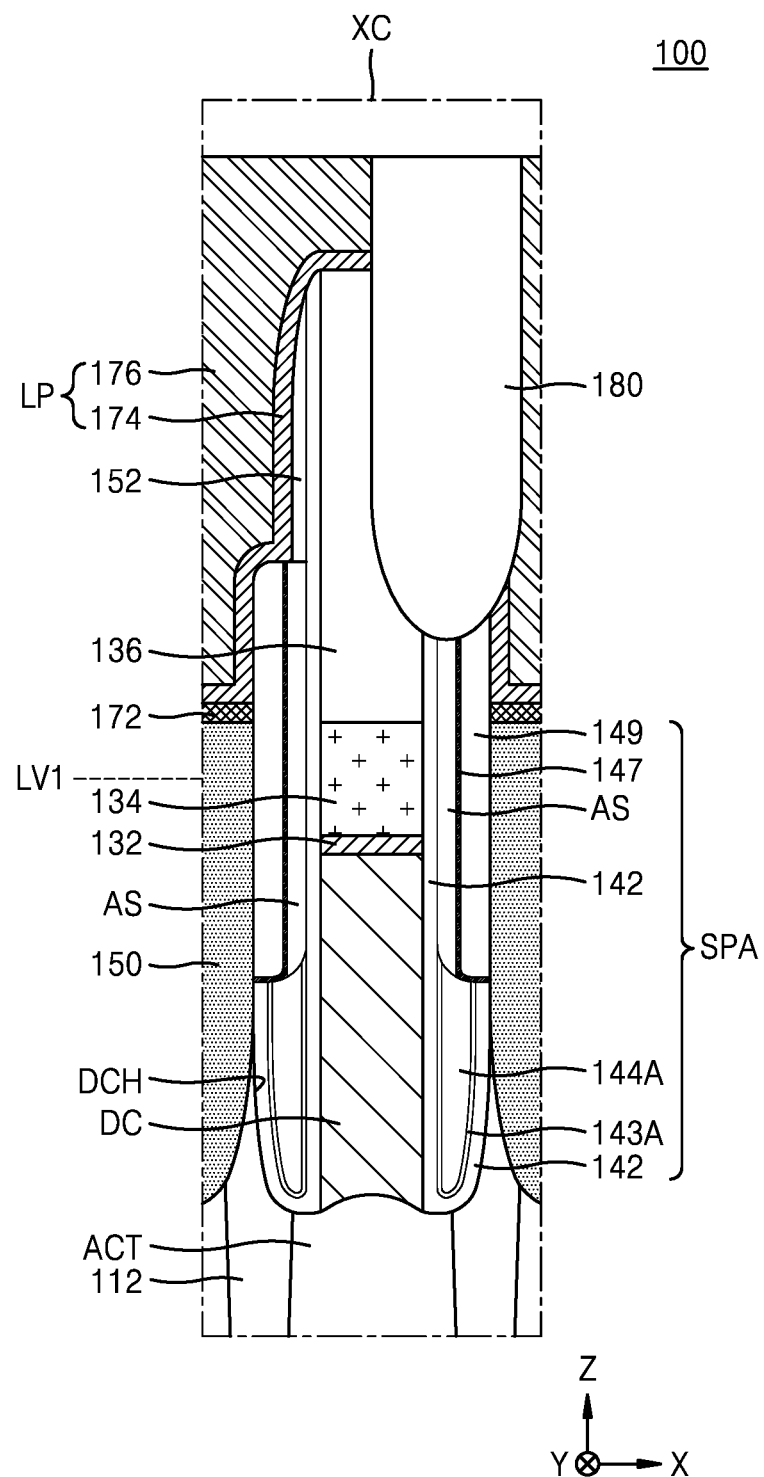
FIG. 2B is a cross-sectional view illustrating an enlargement of a partial region of FIG. 2A in detail.
Figure 2C:
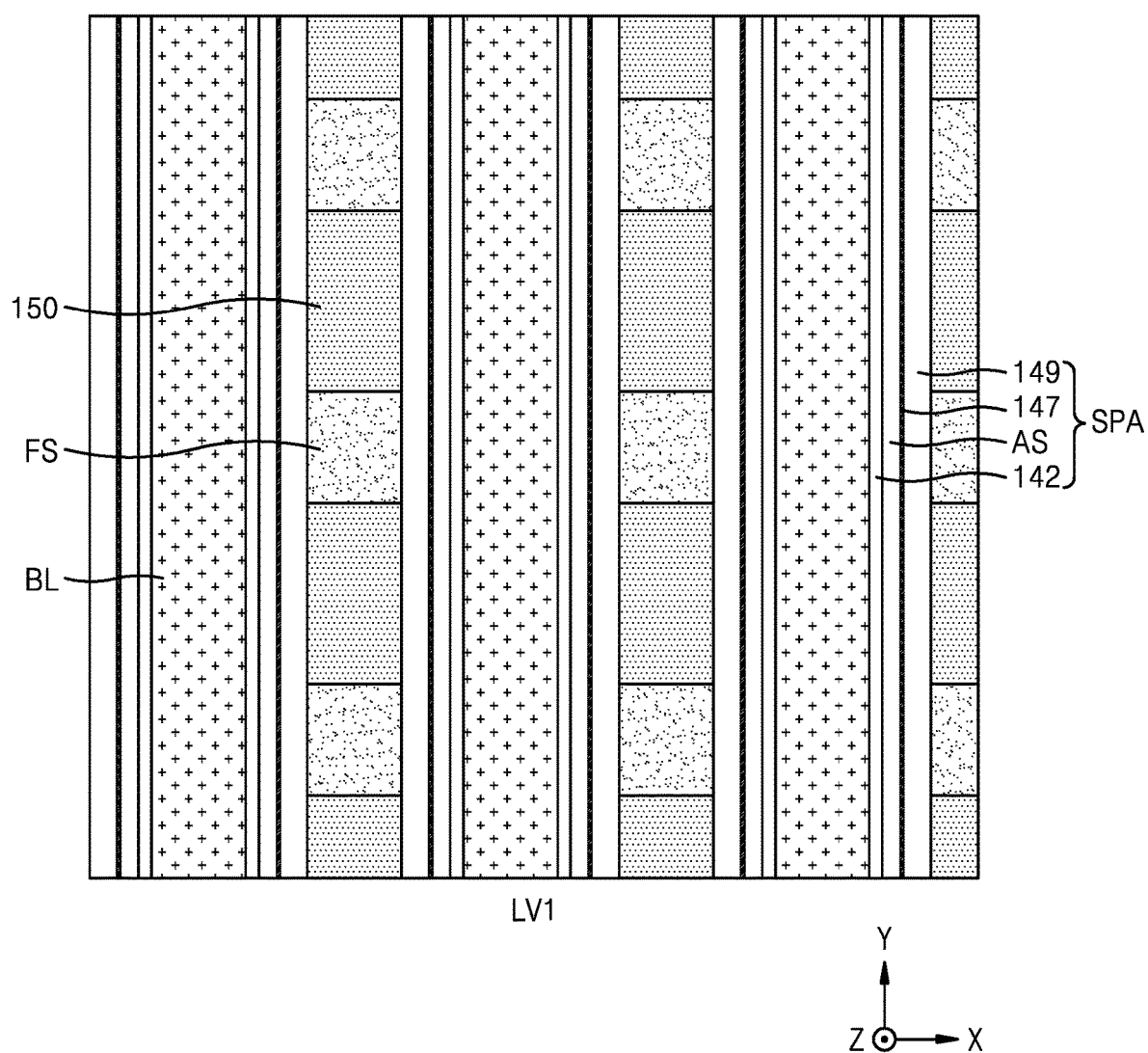
FIG. 2C is a plan view illustrating the partial region of FIG. 2A.

FIG. 2A is a cross-sectional view illustrating an integrated circuit device 100 according to embodiments of the inventive concept. FIG. 2B is a cross-sectional view illustrating an enlargement of a portion corresponding to a dotted line region XC of FIG. 2A in more detail. FIG. 2C is a plan view illustrating a partial region at a first level LV1 of FIG. 2A. The integrated circuit device 100 illustrated in FIGS. 2A to 2C may form a part of the integrated circuit device 10 illustrated in FIG. 1. FIG. 2A(a) may be a partial region corresponding to the cross-section taken along line A-A' of FIG. 1 and FIG. 2A(b) may be a partial region corresponding to the cross-section taken along line B-B' of FIG. 1.

Referring to FIGS. 2A to 2C, the integrated circuit device 100 includes a substrate 110 in which the plurality of active regions ACT are defined by a device isolation layer 112. The device isolation layer 112 is formed in a device isolation trench T1 formed in the substrate 110. The device isolation layer 112 may include a silicon oxide layer, a silicon nitride layer, or a combination of the above layers.

The substrate 110 may include silicon, for example, single crystalline silicon, polycrystalline silicon, or amorphous silicon. In other embodiments, the substrate 110 may include at least one of Ge, SiGe, SiC, GaAs, InAs, and InP. In some embodiments, the substrate 110 may include a conductive region, for example, a well doped with impurities or a structure doped with impurities.

In the substrate 110, a plurality of word line trenches T2 that extend in the first horizontal direction (the X direction) are formed. In the plurality of word line trenches T2, gate dielectric layers 116, word lines 118, and buried insulating layers 120 are formed. The word line 118 may correspond to the word lines WL illustrated in FIG. 1. A plurality of first recess spaces 120R may be formed in upper surfaces of the buried insulating layers 120.

On the substrate 110, a first insulating layer 122 and a second insulating layer 124 may be sequentially formed. In an example embodiment, the first insulating layer 122 and the second insulating layer 124 may be sequentially formed on the buried insulating layers 120. The first insulating layer 122 and the second insulating layer 124 may be formed of silicon oxide, silicon nitride, or a combination thereof.

The plurality of direct contacts DC may be respectively arranged on partial regions of the plurality of active regions ACT. On the substrate 110, the plurality of bit lines BL and a plurality of insulation capping patterns 136 that cover the plurality of bit lines BL may extend in parallel. The plurality of bit lines BL and the plurality of insulation capping patterns 136 may form a plurality of line structures BL and 136. The plurality of line structures BL and 136 may extend on the second insulating layer 124 and the plurality of direct contacts DC in the second horizontal direction (the Y direction).

Among the plurality of line structures BL and 136, between a pair of adjacent line structures BL and 136, a plurality of conductive plugs 150 may be arranged in a line in the second horizontal direction (the Y direction). Between the pair of adjacent line structures BL and 136, a plurality of insulating fences FS may be arranged. The plurality of insulating fences FS fill the plurality of first recess spaces 120R formed in the upper surfaces of the buried insulating layers 120 and may be arranged among the plurality of conductive plugs 150. In an example embodiment, each of the insulating fences FS and each of the conductive plugs 150 may be alternately arranged in the second horizontal direction (the Y direction). The plurality of conductive plugs 150 may be spaced apart from each other in the second horizontal direction (the Y direction) and may be insulated from each other by the plurality of insulating fences FS. The plurality of conductive plugs 150 may form the plurality of buried contacts BC illustrated in FIG. 1.

The plurality of bit lines BL may extend in parallel on the second insulating layer 124 in the second horizontal direction (the Y direction). The plurality of bit lines BL may be formed of doped polysilicon, TiN, TiSiN, W, tungsten silicide, or a combination thereof. The plurality of insulation capping patterns 136 may include a silicon nitride layer.

The plurality of bit lines BL may be respectively connected to the plurality of active regions ACT through the plurality of direct contacts DC. One direct contact DC and a pair of conductive plugs 150 that face each other with the one direct contact DC therebetween may be respectively connected to different active regions ACT among the plurality of active regions ACT. In some embodiments, the direct contact DC may be formed of silicon (Si), germanium (Ge), tungsten (W), WN, cobalt (Co), nickel (Ni), aluminum (Al), molybdenum (Mo), ruthenium (Ru), titanium (Ti), TiN, tantalum (Ta), TaN, copper (Cu), or a combination thereof. In some embodiments, the direct contact DC may include an epitaxial silicon layer.

Each of the plurality of bit lines BL may include a lower conductive layer 130, an intermediate conductive layer 132, and an upper conductive layer 134 that are sequentially formed on the substrate 110. In an example embodiment, the lower conductive layer 130 and the direct contact DC may be formed in the same process. Each of the plurality of bit lines BL may also include the direct contact DC. In a cross-sectional view, some portions of each bit line BL may be seen as including the lower conductive layer 130, the intermediate conductive layer 132 and the upper conductive layer 134, and the others as including the direct contact DC, the intermediate conductive layer 132 and the upper conductive layer 134. An upper surface of the lower conductive layer 130 and an upper surface of the direct contact DC may be positioned at the same height. In FIG. 2A, it is illustrated that each of the plurality of bit lines BL has a three-layer structure including the lower conductive layer 130, the intermediate conductive layer 132, and the upper conductive layer 134. However, the inventive concept is not limited thereto. For example, each of the plurality of bit lines BL may have a stack structure of a single layer structure, a double layer structure, or a no less than four-layer structure. In some embodiments, the lower conductive layer 130 may be formed of doped polysilicon. The intermediate conductive layer 132 and the upper conductive layer 134 may be formed of TiN, TiSiN, W, tungsten silicide, or a combination thereof. For example, the intermediate conductive layer 132 may be formed of TiN and/or TiSiN and the upper conductive layer 134 may be formed of W.

The plurality of conductive plugs 150 may be pillar-shaped and extend on the substrate 110 along spaces among the plurality of bit lines BL in the vertical direction (the Z direction). The plurality of conductive plugs 150 may extend to a level lower than an upper surface of the substrate 110 through the first insulating layer 122 and the second insulating layer 124. Bottoms of the plurality of conductive plugs 150 may contact the plurality of active regions ACT. The plurality of conductive plugs 150 may be formed of a semiconductor material doped with impurities, metal, a conductive metal nitride, or a combination thereof. For example, the plurality of conductive plugs 150 may be formed of doped polysilicon.

The plurality of insulating fences FS may be pillar-shaped and extend on the substrate 110 along the spaces among the plurality of bit lines BL in the vertical direction (the Z direction). The plurality of insulating fences FS may include a silicon nitride layer. However, the inventive concept is not limited thereto.

A plurality of metal silicide layers 172 may be formed on the plurality of conductive plugs 150. The plurality of metal silicide layers 172 may be formed of Co silicide, Ni silicide, or manganese (Mn) silicide. However, the inventive concept is not limited thereto.

The plurality of conductive landing pads LP may be formed on the plurality of metal silicide layers 172. The plurality of conductive landing pads LP may be respectively connected to the plurality of conductive plugs 150 through the plurality of metal silicide layers 172. The plurality of conductive landing pads LP may extend from lower spaces among the plurality of insulation capping patterns 136 to upper spaces of the plurality of insulation capping patterns 136 to vertically overlap parts of the plurality of bit lines BL. The plurality of conductive landing pads LP may include conductive barrier layers 174 and conductive layers 176. The conductive barrier layers 174 may be formed of Ti, TiN, or a combination thereof. The conductive layers 176 may be formed of metal, a metal nitride, doped polysilicon, or a combination thereof. For example, the conductive layers 176 may include W.

The plurality of conductive landing pads LP may be in the form of a plurality of island-shaped patterns seen from a plane (e.g., in a top down view). The plurality of conductive landing pads LP may be electrically isolated from each other by an insulating layer 180 that surrounds each of the plurality of conductive landing pads LP. The insulating layer 180 may include a silicon nitride layer, a silicon oxide layer, or a combination thereof.

Insulating spacers SPA are between the plurality of bit lines BL and the plurality of conductive plugs 150 and between the plurality of bit lines BL and the plurality of insulating fences FS, and upper insulating spacers 152 are between the plurality of insulation capping patterns 136 and the plurality of conductive landing pads LP. The insulating spacers SPA may include portions between the plurality of insulation capping patterns 136 and the plurality of conductive landing pads LP. In the first horizontal direction (the X direction), a width of the insulating spacer SPA may be greater than that of the upper insulating spacer 152. The insulating spacers SPA may be linear to extend in parallel to the plurality of bit lines BL in the second horizontal direction (the Y direction). The upper insulating spacers 152 may be ring-shaped to surround the plurality of conductive landing pads LP.

As illustrated in FIG. 2C, at the first level LV1, each of the plurality of conductive plugs 150 may include opposite side walls in the second horizontal direction (the Y direction) that contact two corresponding insulating fences of the plurality of insulating fences FS. In an example embodiment, each of the conductive plugs 150 and each of the insulating fences FS may be alternately arranged in the second horizontal direction (the Y direction). On the other hand, since the upper insulating spacers 152 are ring-shaped to surround the plurality of conductive landing pads LP, among the side walls of the conductive landing pads LP, partial regions of both side walls at opposite sides in the second horizontal direction (the Y direction) may be spaced apart from the plurality of insulating fences FS with the upper insulating spacers 152 therebetween.

Each of the insulating spacers SPA may have a multilayer structure including an insulating liner 142. In some embodiments, the insulating spacer SPA may include the insulating liner 142, an air spacer AS, an outer barrier layer 147, and an outer spacer 149 that are sequentially arranged from side walls of the bit line BL toward the conductive plug 150. The outer barrier layer 147 may prevent oxygen from diffusing into the outer spacer 149. In the current specification, the outer barrier layer 147 may be referred to as "the barrier layer 147".

The insulating liner 142 may be arranged in a space between the bit line BL and the conductive plug 150, a space between the insulation capping pattern 136 and the conductive landing pad LP, and a space between the direct contact DC and the conductive plug 150. The upper insulating spacer 152 may be spaced apart from the insulation capping pattern 136 with the insulating liner 142 therebetween. The insulating liner 142 may include a silicon nitride layer.

In addition, the insulating spacer SPA may include a buried spacer 144A and an inner spacer 143A. The buried spacer 144A may fill the space between the direct contact DC and the conductive plug 150 on the insulating liner 142. The inner spacer 143A may be disposed between the insulating liner 142 and the buried spacer 144A in the space between the direct contact DC and the conductive plug 150. The inner spacer 143A may include a silicon oxide layer. The inner spacer 143A may have a thickness less than that of the insulating liner 142.

The insulating liner 142 and the outer barrier layer 147 may face each other with the air spacer AS therebetween. In the current specification, the term "air" may mean air or other gases that may exist in manufacturing processes.

In some embodiments, the outer barrier layer 147 may be formed of a two-dimensional material having a two-dimensional crystalline structure. The two-dimensional material may refer to a layer with a thickness of a few nanometres or less. The outer barrier layer 147 formed of the two-dimensional material may have a band gap of at least 1.3 eV. The two-dimensional material that may form the outer barrier layer 147 may be selected from hexagonal boron nitride (h-BN), GaS, GaSe, phosphorene, $WS_2$, $WSe_2$, $MoS_2$, $MoSe_2$, $ReS_2$, and $ReSe_2$. However, the inventive concept is not limited thereto. For example, h-BN may have a band gap of about 5.97 eV. $WS_2$, $WSe_2$, $MoS_2$, and $MoSe_2$ may have band gaps in a range of about 1.4 eV to about 2.0 eV.

In some embodiments, the outer barrier layer 147 may include a monomolecular layer of a two-dimensional material. In other embodiments, the outer barrier layer 147 may include a plurality of monomolecular layers of the two-dimensional material. The plurality of monomolecular layers may be combined by Van der Waals forces.

The outer barrier layer 147 may have a first thickness corresponding to a thickness of the monomolecular layer of the two-dimensional material in the first horizontal direction (the X direction) that is a width direction of the bit line BL or a thickness corresponding to N times (N is a natural number) the first thickness. Here, when the outer barrier layer 147 includes a plurality of monomolecular layers sequentially stacked in the first horizontal direction (the X direction) that is the width direction of the bit line BL, the natural number N may correspond to the number of monomolecular layers. For example, the outer barrier layer 147 may have a thickness of about 3 Å to about 10 Å or about 3 Å to about 5 Å. However, the inventive concept is not limited thereto.

In other embodiments, the outer barrier layer 147 may be formed of SiC or SiCN.

The outer spacer 149 may contact the outer barrier layer 147. The outer spacer 149 may be spaced apart from the air spacer AS with the outer barrier layer 147 therebetween. The outer spacer 149 may include a silicon nitride layer or a silicon nitride layer doped with at least one of an oxygen atom (O) and a carbon atom (C). The doped silicon nitride layer may be SiON, SiCN, or SiOCN. The term "contact," as used herein, refers to a direct connection (i.e., touching) unless the context indicates otherwise.

Figure 3A:
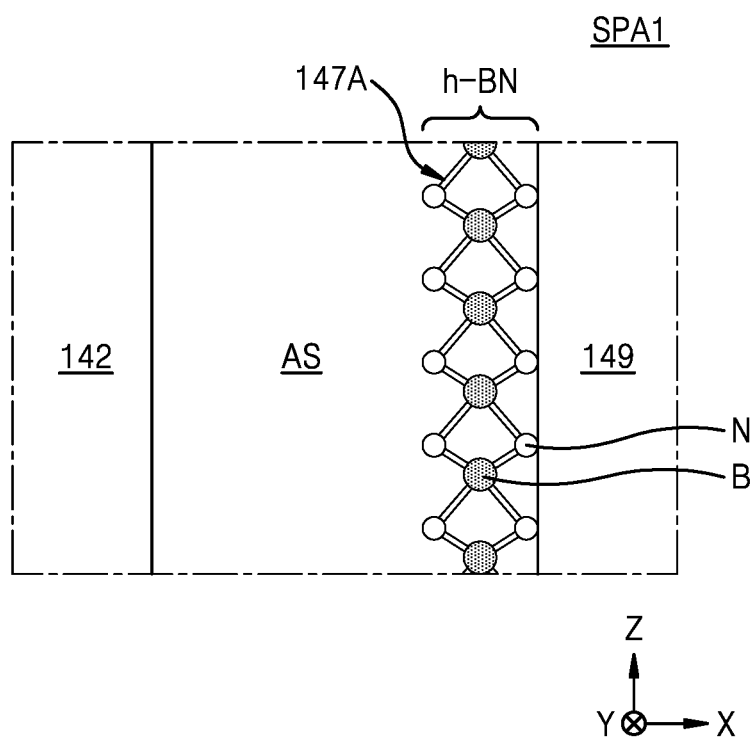
FIG. 3A is a cross-sectional view illustrating an enlargement of a part of an exemplary insulating spacer of an integrated circuit device according to embodiments of the inventive concept.

FIG. 3A is a cross-sectional view illustrating an enlargement of a part of an exemplary insulating spacer SPA1 that may be adopted as the insulating spacer SPA of the integrated circuit device 100 illustrated in FIGS. 2A to 2C.

Referring to FIG. 3A, the insulating spacer SPA1 has the same configuration as that of the insulating spacer SPA described with reference to FIGS. 2A to 2C. As an example of the outer barrier layer 147 of FIGS. 2A to 2C, the insulating spacer SPA1 of FIG. 3A may include an outer barrier layer 147A.

Figure 3B:
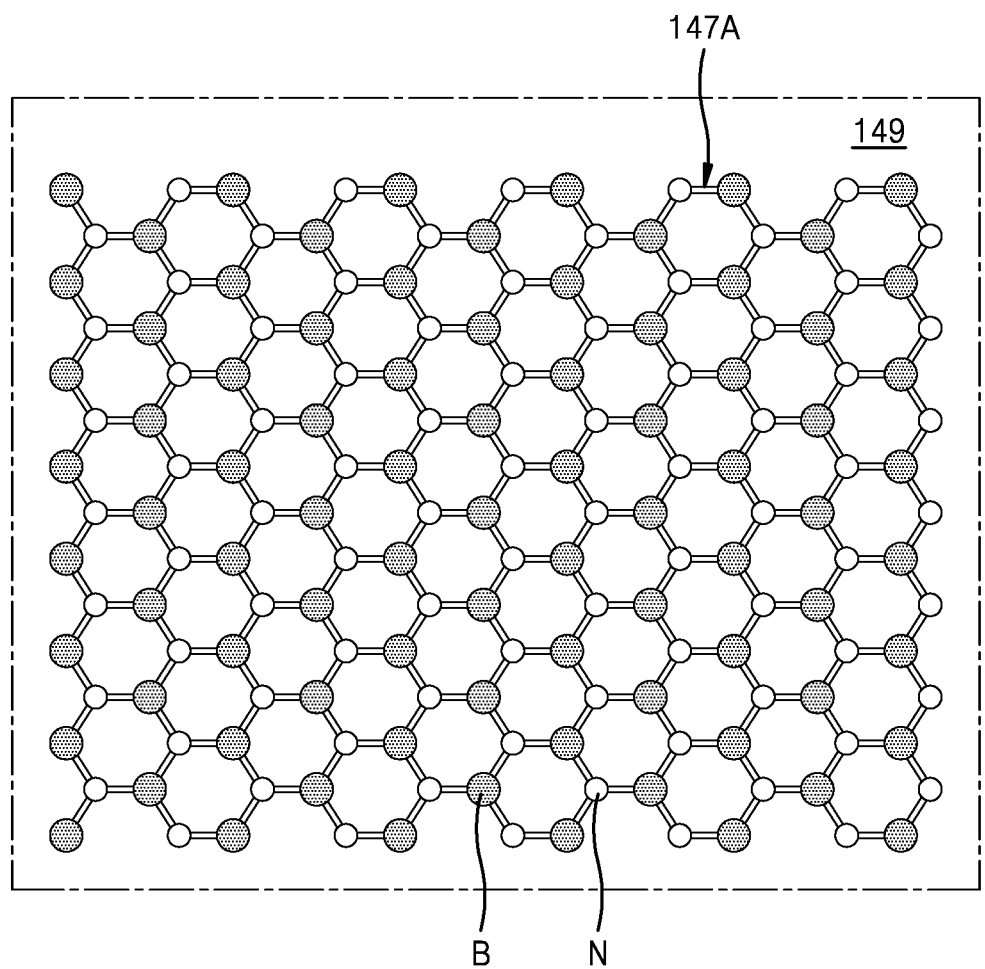
FIG. 3B is a plan view illustrating enlargements of parts of an outer barrier layer and an outer spacer of an exemplary insulating spacer of an integrated circuit device according to embodiments of the inventive concept.

FIG. 3B is a plan view illustrating enlargements of parts of the outer barrier layer 147A and the outer spacer 149 as seen from the air spacer AS of the insulating spacer SPA1. The outer barrier layer 147A may be disposed between the air spacer AS and the outer spacer 149, but since the outer barrier layer 147A may be a two dimensional material, the outer spacer 149 may be seen, through the outer barrier layer 147A, from the air spacer AS.

Referring to FIGS. 3A and 3B, the outer barrier layer 147A includes a monomolecular layer of h-BN that is a two-dimensional material.

Figure 4A:
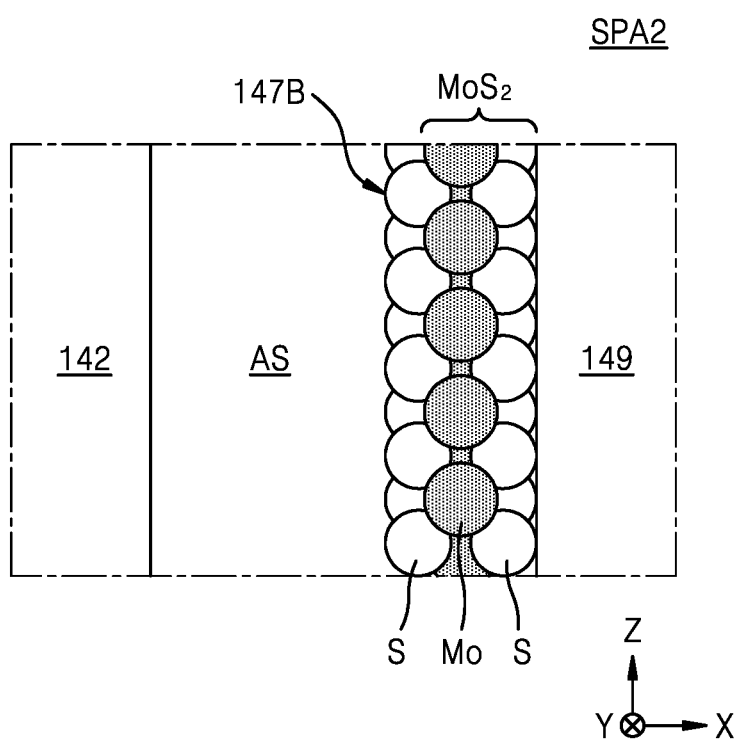
FIG. 4A is a cross-sectional view illustrating an enlargement of a part of an exemplary insulating spacer of an integrated circuit device according to embodiments of the inventive concept.

FIG. 4A is a cross-sectional view illustrating an enlargement of a part of an exemplary insulating spacer SPA2 that may be adopted as the insulating spacer SPA of the integrated circuit device 100 illustrated in FIGS. 2A to 2C.

Referring to FIG. 4A, the insulating spacer SPA2 has the same configuration as that of the insulating spacer SPA described with reference to FIGS. 2A to 2C. As another example of the outer barrier layer 147 of FIGS. 2A to 2C, the insulating spacer SPA2 may include an outer barrier layer 147B.

Figure 4B:
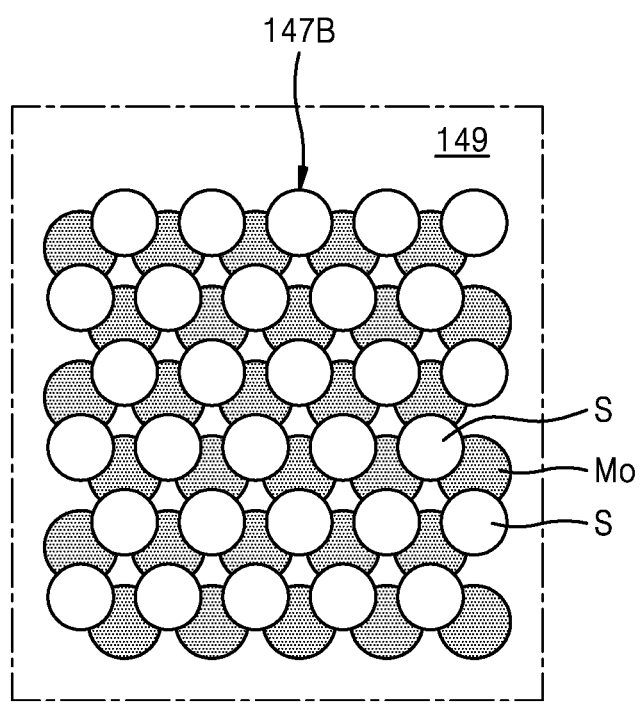
FIG. 4B is a plan view illustrating enlargements of parts of an outer barrier layer and an outer spacer of another exemplary insulating spacer of an integrated circuit device according to embodiments of the inventive concept.

FIG. 4B is a plan view illustrating enlargements of parts of the outer barrier layer 147B and the outer spacer 149 as seen from the air spacer AS of the insulating spacer SPA2.

Referring to FIGS. 4A and 4B, the outer barrier layer 147B includes a monomolecular layer of $MoS_2$ that is a two-dimensional material.

The insulating spacer SPA1 illustrated in FIGS. 3A and 3B and the insulating spacer SPA2 illustrated in FIGS. 4A and 4B are for describing the insulating spacer SPA of the integrated circuit device 100 illustrated in FIGS. 2A to 2C in a more detailed example. Elements that may be adopted as the outer barrier layer 147 of the insulating spacer SPA of the integrated circuit device 100 illustrated in FIGS. 2A to 2C are not limited to the outer barrier layer 147A illustrated in FIG. 3B and the outer barrier layer 147B illustrated in FIG. 4B and may vary within the scope of the inventive concept.

Figure 5A:
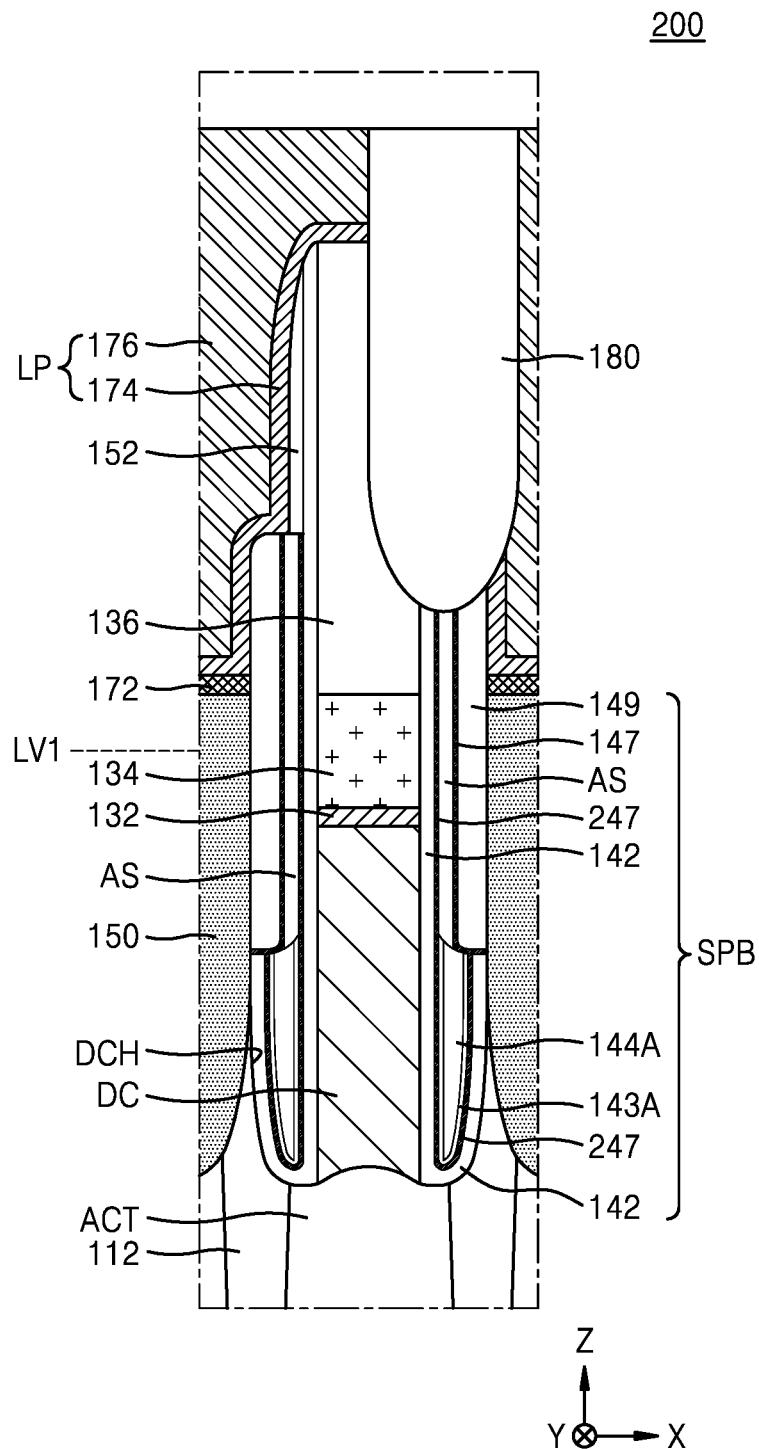
FIG. 5A is a cross-sectional view illustrating an integrated circuit device according to other embodiments of the inventive concept.
Figure 5B:
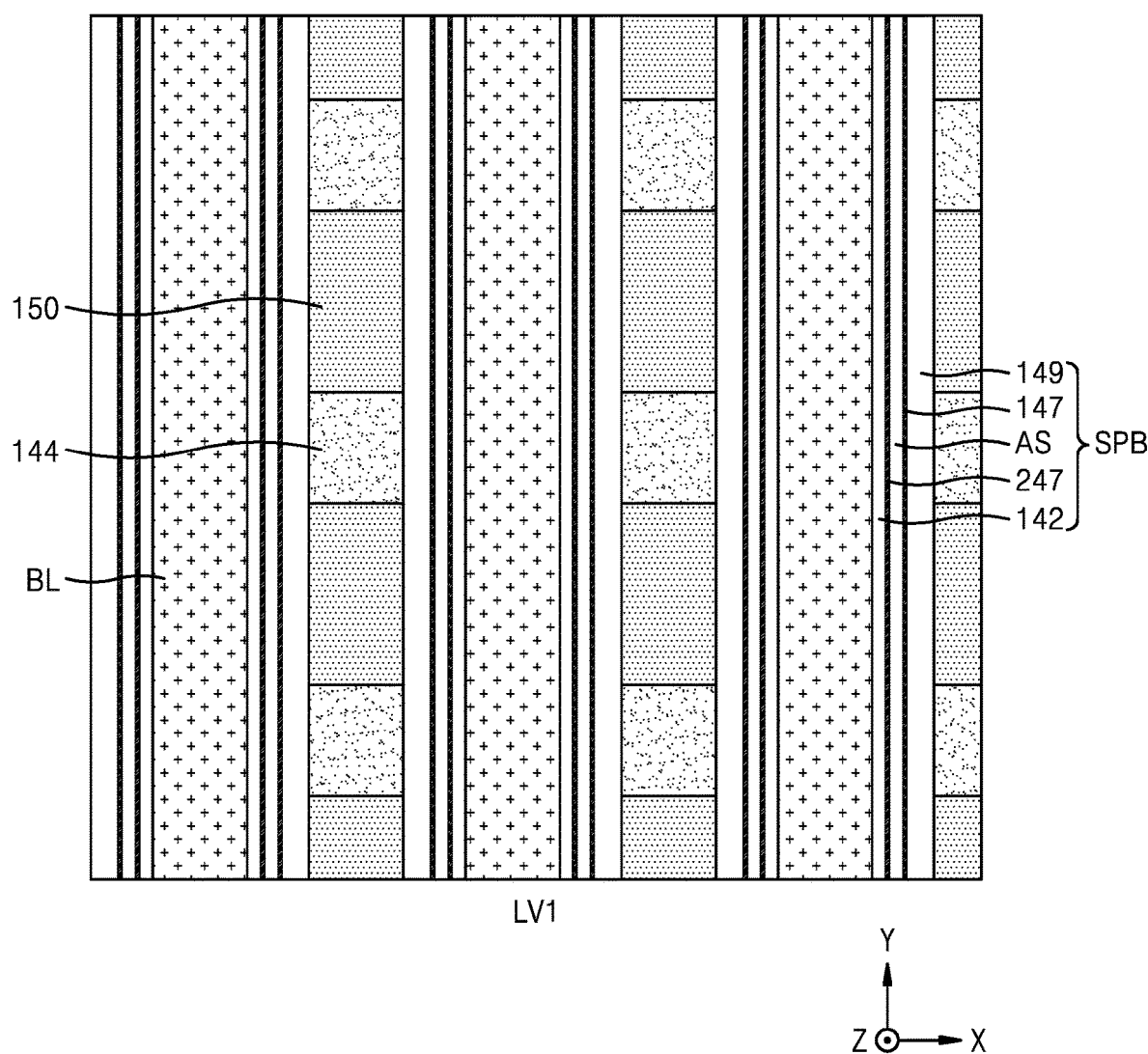
FIG. 5B is a plan view illustrating the integrated circuit device of FIG. 5A.

FIG. 5A is a cross-sectional view illustrating main portions of an integrated circuit device 200 according to other embodiments of the inventive concept. FIG. 5B is a plan view illustrating a partial region of the integrated circuit device 200 having the configuration illustrated in FIG. 5A at the first level LV1. In FIG. 5A, a partial region of the integrated circuit device 200 corresponding to a dotted line region XC of (a) of FIG. 2A is illustrated.

Referring to FIGS. 5A and 5B, the integrated circuit device 200 has the same configuration as that of the integrated circuit device 100 illustrated in FIGS. 2A to 2C. The integrated circuit device 200 includes an insulating spacer SPB. The insulating spacer SPB has the same configuration as that of the insulating spacer SPA of the integrated circuit device 100 described with reference to FIGS. 2A to 2C. The insulating spacer SPB further includes the inner barrier layer 247 between the insulating liner 142 and the air spacer AS while covering the side walls of the bit line BL. The inner barrier layer 247 may extend to a lower level than that of the upper surface of the substrate 110 to be between the insulating liner 142 and the inner spacer 143A while covering side walls of the direct contact DC. In addition, the inner barrier layer 247 may extend to a higher level than that of the bit line BL to be between the insulating liner 142 and the air spacer AS while covering side walls of the insulation capping pattern 136.

In some embodiments, the inner barrier layer 247 may include a two-dimensional material layer having a two-dimensional crystalline structure. The two-dimensional material layer that forms the inner barrier layer 247 may have a band gap of at least 1.3 eV. The two-dimensional material that may form the inner barrier layer 247 may be selected from h-BN, GaS, GaSe, phosphorene, $WS_2$, $WSe_2$, $MoS_2$, $MoSe_2$, $ReS_2$, and $ReSe_2$. However, the inventive concept is not limited thereto.

In other embodiments, the inner barrier layer 247 may be formed of SiC or SiCN.

Detailed configuration of the inner barrier layer 247 is the same as that of the outer barrier layer 147. In some embodiments, the inner barrier layer 247 and the outer barrier layer 147 may be formed of the same material. In other embodiments, the inner barrier layer 247 and the outer barrier layer 147 may be formed of different materials.

Figure 6:
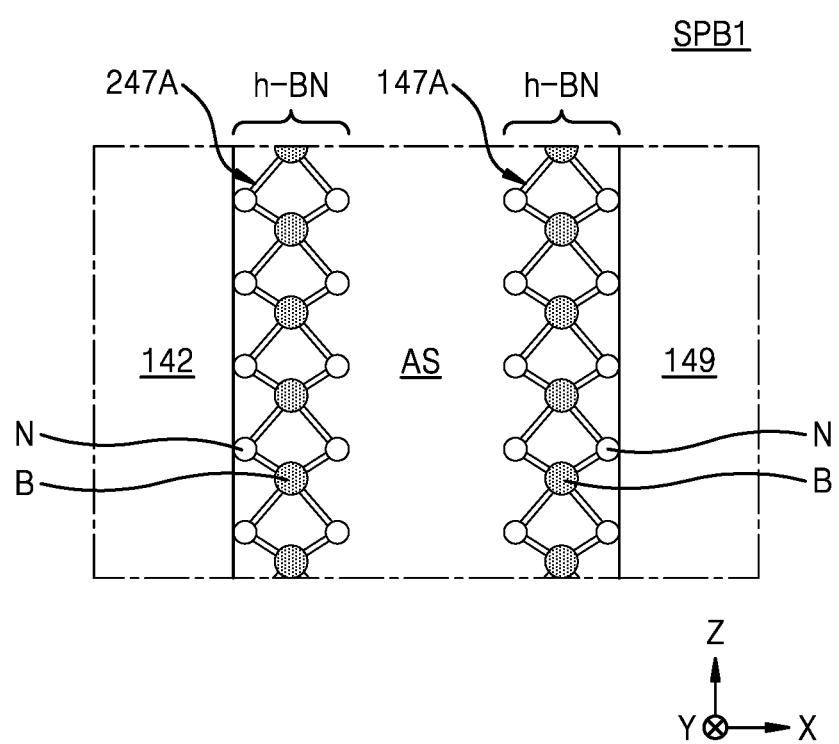
FIG. 6 is a cross-sectional view illustrating an enlargement of a part of an exemplary insulating spacer of an integrated circuit device according to other embodiments of the inventive concept.

FIG. 6 is a cross-sectional view illustrating an enlargement of a part of an exemplary insulating spacer SPB1 that may be adopted as the insulating spacer SPB of the integrated circuit device 200 illustrated in FIGS. 5A and 5B.

Referring to FIG. 6, the insulating spacer SPB1 has the same configuration as that of the insulating spacer SPB described with reference to FIGS. 5A and 5B. The outer barrier layer 147A is included as an example of the outer barrier layer 147 of FIGS. 5A and 5B and an inner barrier layer 247A is included as an example of the inner barrier layer 247 of FIGS. 5A and 5B. The outer barrier layer 147A and the inner barrier layer 247A may include a monomolecular layer of h-BN that is a two-dimensional material.

The insulating spacer SPB1 illustrated in FIG. 6 is a detailed example of the insulating spacer SPB of the integrated circuit device 200 illustrated in FIGS. 5A and 5B. Elements that may be adopted as the outer barrier layer 147 and the inner barrier layer 247 of the insulating spacer SPB are not limited to the outer barrier layer 147A and the inner barrier layer 247A illustrated in FIG. 6 and may vary within the scope of the inventive concept.

In each of the integrated circuit devices 100 and 200 described with reference to FIGS. 2A to 6 according to embodiments of the inventive concept, in each of the insulating spacers SPA and SPB that cover the opposite side walls of the bit line BL, between the air spacer AS and the outer spacer 149, the outer barrier layer 147 is formed. It is possible to prevent the outer spacer 149 from being damaged due to the outer barrier layer 147 and to secure sufficient insulating distances between the bit line BL and conductive regions in the vicinity of the bit line BL. In addition, the insulating spacer SPB that covers the opposite side walls of the bit line BL of the integrated circuit device 200 illustrated in FIGS. 5A and 5B includes the outer spacer 149 and the inner barrier layer 247 apart from each other with the air spacer AS therebetween and accordingly, it is possible to secure sufficient insulating distances between the bit line BL and the conductive regions in the vicinity of the bit line BL.

FIGS. 7 to 19B are cross-sectional views illustrating a method of manufacturing an integrated circuit device in the order of processes, according to embodiments of the inventive concept. In particular, in (a) of each of FIGS. 7 to 12, 13A, 14 to 17, 18A, and 19A, the cross-section taken along line A-A' of FIG. 1 is shown and, in (b) of each of FIGS. 7 to 12, 13A, 14 to 17, 18A, and 19A, the cross-section taken along line B-B' of FIG. 1 is shown. FIGS. 13B, 18B, and 19B are cross-sectional views each illustrating an enlargement of a portion corresponding to a dotted line region XC in (a) of each of FIGS. 13A, 18A, and 19A in more detail. An exemplary method of manufacturing the integrated circuit device 100 illustrated in FIGS. 2A to 2C will be described with reference to FIGS. 7 to 19B.

Figure 7:
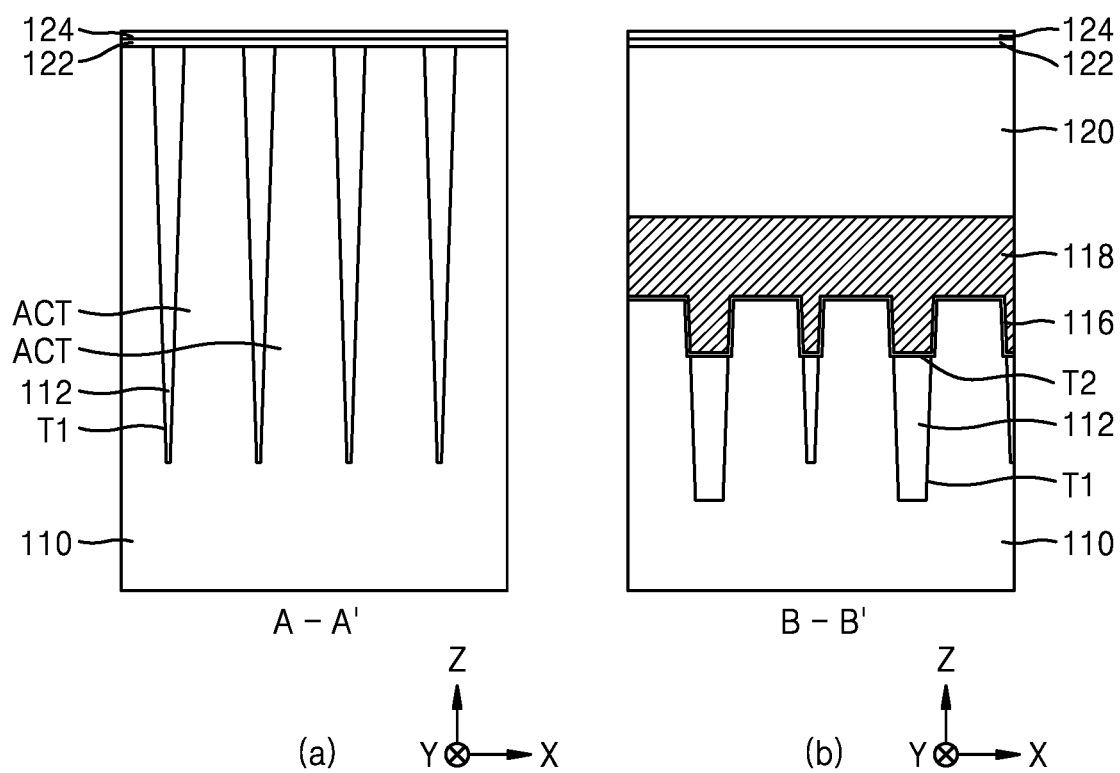
FIGS. 7 to 12, 13A and 13B, 14 to 17, 18A and 18B, and 19A and 19B are cross-sectional views illustrating a method of manufacturing an integrated circuit device in the order of processes, according to embodiments of the inventive concept.

Referring to FIG. 7, the device isolation trench T1 is formed in the substrate 110 and the device isolation layer 112 is formed in the isolation trench T1. The plurality of active regions ACT may be defined by the device isolation layer 112 in the substrate 110.

The plurality of word line trenches T2 may be formed in the substrate 110 and the device isolation layer 112. The plurality of word line trenches T2 extend to run parallel in the first horizontal direction (the X direction) and may linearly cross the plurality of active regions ACT. As illustrated in (b) of FIG. 7, in order to form the plurality of word line trenches T2 with bottom surfaces in which step differences are formed, etching the plurality of device isolation layers 112 and the substrate 110 may be performed in separate etching processes so that an etching depth of the plurality of device isolation layers 112 may be made different from that of the substrate 110. After cleaning a resultant structure in which the plurality of word line trenches T2 are formed, in the plurality of word line trenches T2, the gate dielectric layers 116, the word lines 118, and the buried insulating layers 120 may be sequentially formed. In some embodiments, after forming the plurality of word lines 118, by implanting impurity ions into the substrate 110 at opposite sides of each of the plurality of word lines 118, a plurality of source/drain regions may be formed on upper surfaces of the plurality of active regions ACT. In other embodiments, before forming the plurality of word lines 118, an impurity ion implanting process for forming the plurality of source/drain regions may be performed.

The gate dielectric layers 116 may include at least one of a silicon oxide layer, a silicon nitride layer, a silicon oxynitride layer, oxide/nitride/oxide (ONO), and a high-k dielectric layer having a dielectric constant higher than that of a silicon oxide layer. For example, the gate dielectric layers 116 may have a dielectric constant of about 10 to about 25. In some embodiments, the gate dielectric layers 116 may be formed of $HfO_2$, $Al_2O_3$, $HfAlO_3$, $Ta_2O_3$, $TiO_2$, or a combination thereof. However, the inventive concept is not limited thereto. The plurality of word lines 118 may be formed of Ti, TiN, Ta, TaN, W, WN, TiSiN, WSiN, or a combination thereof.

Upper surfaces of the plurality of buried insulating layers 120 may be at the same level as that of the upper surface of the substrate 110. The plurality of buried insulating layers 120 may include a silicon oxide layer, a silicon nitride layer, a silicon oxynitride layer, or a combination thereof. The first insulating layer 122 and the second insulating layer 124 may be sequentially formed on the plurality of buried insulating layers 120 and the substrate 110. The first insulating layer 122 and the second insulating layer 124 may cover the upper surfaces of the plurality of active regions ACT, upper surfaces of the device isolation layers 112, and the upper surfaces of the plurality of buried insulating layers 120. In some embodiments, the first insulating layer 122 may include a silicon oxide layer and the second insulating layer 124 may include a silicon nitride layer.

Figure 8:
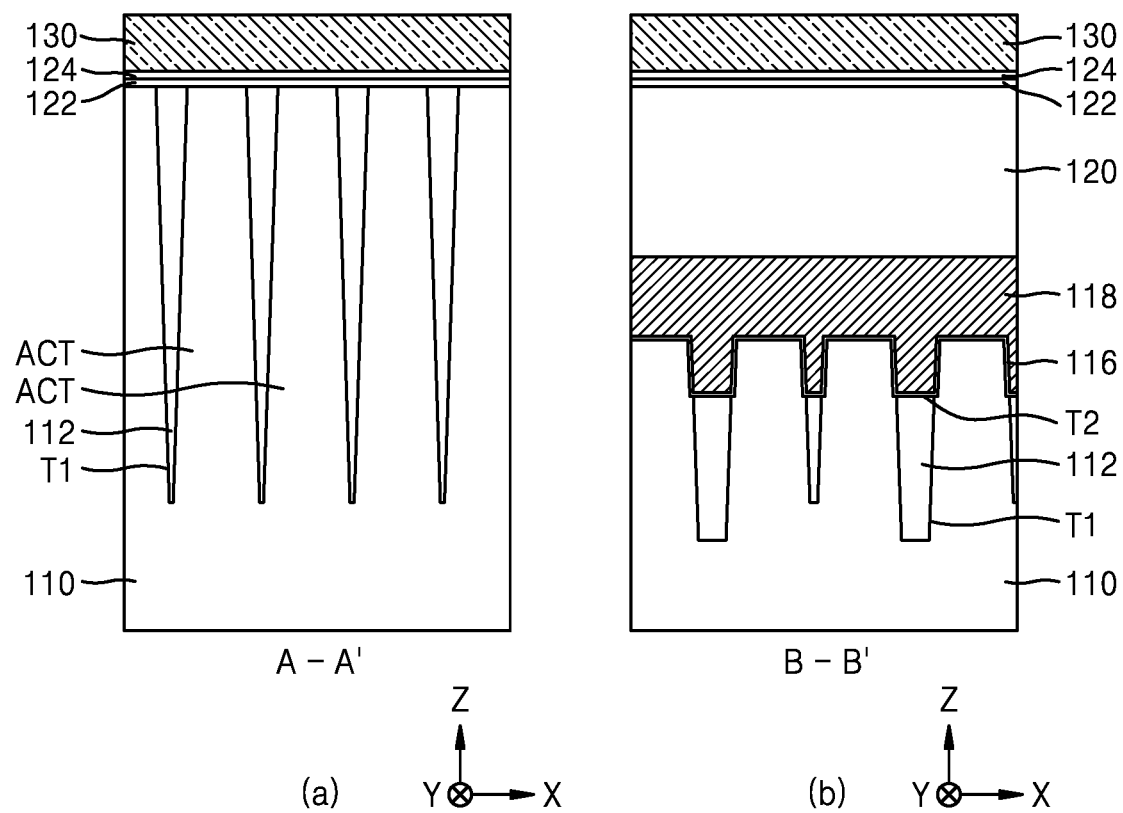

Referring to FIG. 8, a lower conductive layer 130 is formed on the second insulating layer 124. The lower conductive layer 130 may be formed of doped polysilicon.

Figure 9:
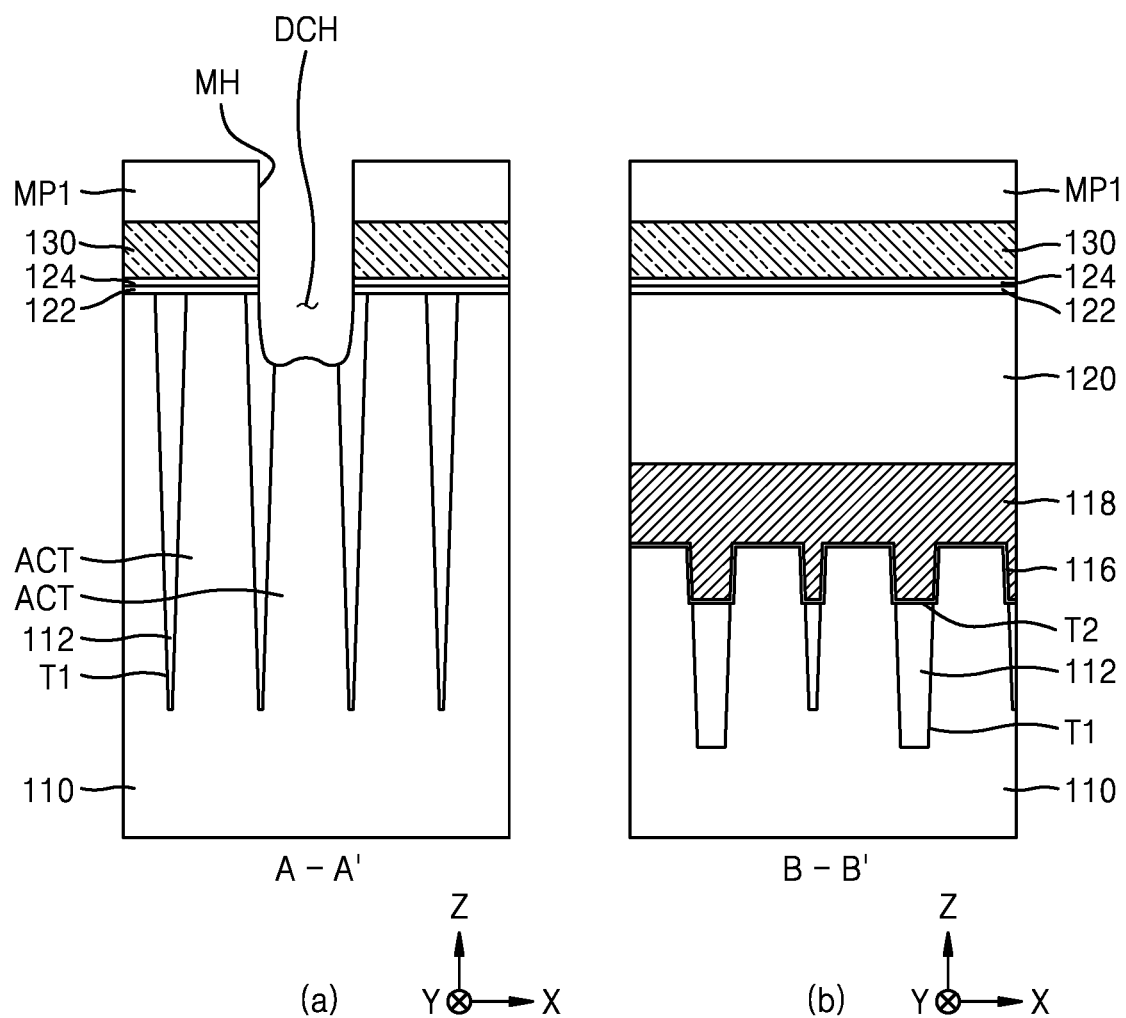

Referring to FIG. 9, after forming a mask pattern MP1 on the lower conductive layer 130, by etching the lower conductive layer 130 exposed through an opening MH of the mask pattern MP1 and etching a part of the substrate 110 and parts of the device isolation layers 112 that are exposed as a result of etching the lower conductive layer 130, a direct contact hole DCH that exposes the active regions ACT of the substrate 110 is formed.

The mask pattern MP1 may include an oxide layer, a nitride layer, or a combination of the above layers. In order to form the mask pattern MP1, a photolithography process may be used.

Figure 10:
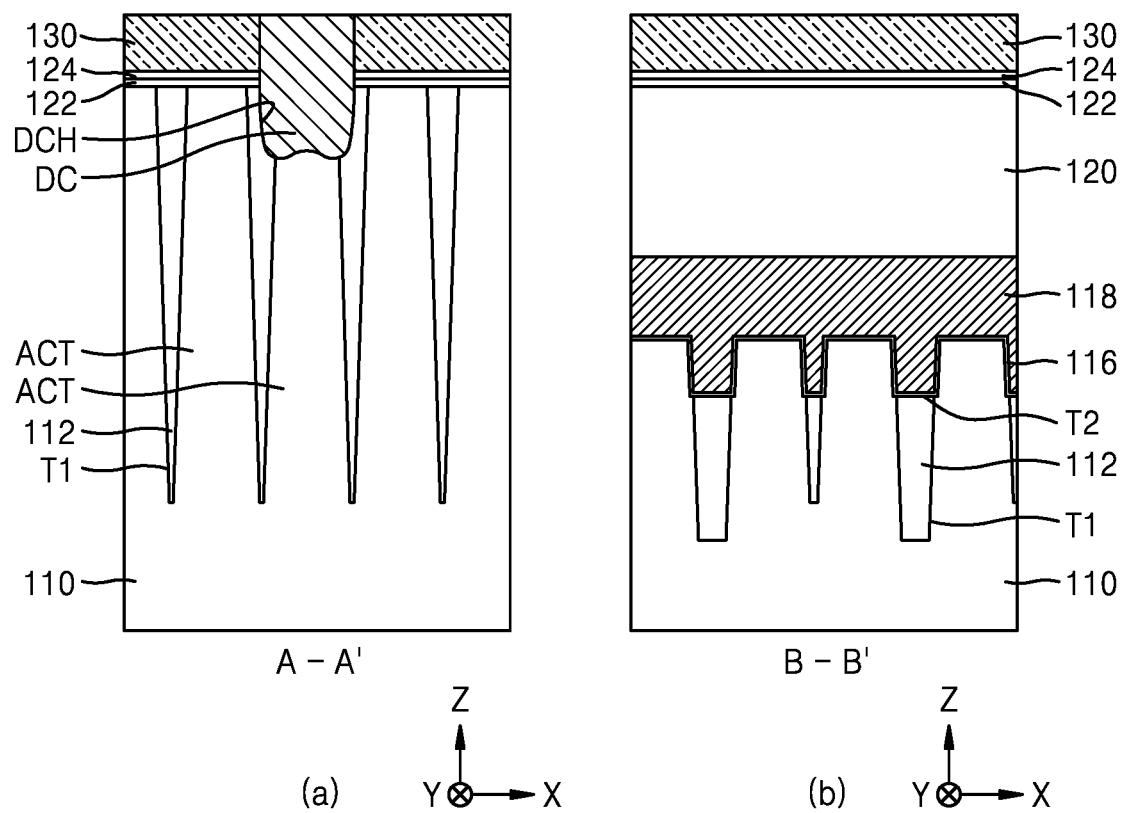

Referring to FIG. 10, the mask pattern MP1 is removed from the resultant structure of FIG. 9 and the direct contact DC is formed in the direct contact hole DCH.

In an exemplary process for forming the direct contact DC, a direct contact forming conductive layer having a thickness sufficient to fill the direct contact hole DCH is formed in the direct contact hole DCH and on the lower conductive layer 130, and the direct contact forming conductive layer may be etched back so that the direct contact forming conductive layer is left only in the direct contact hole DCH. The direct contact forming conductive layer may be formed of doped polysilicon. However, the inventive concept is not limited thereto.

Figure 11:
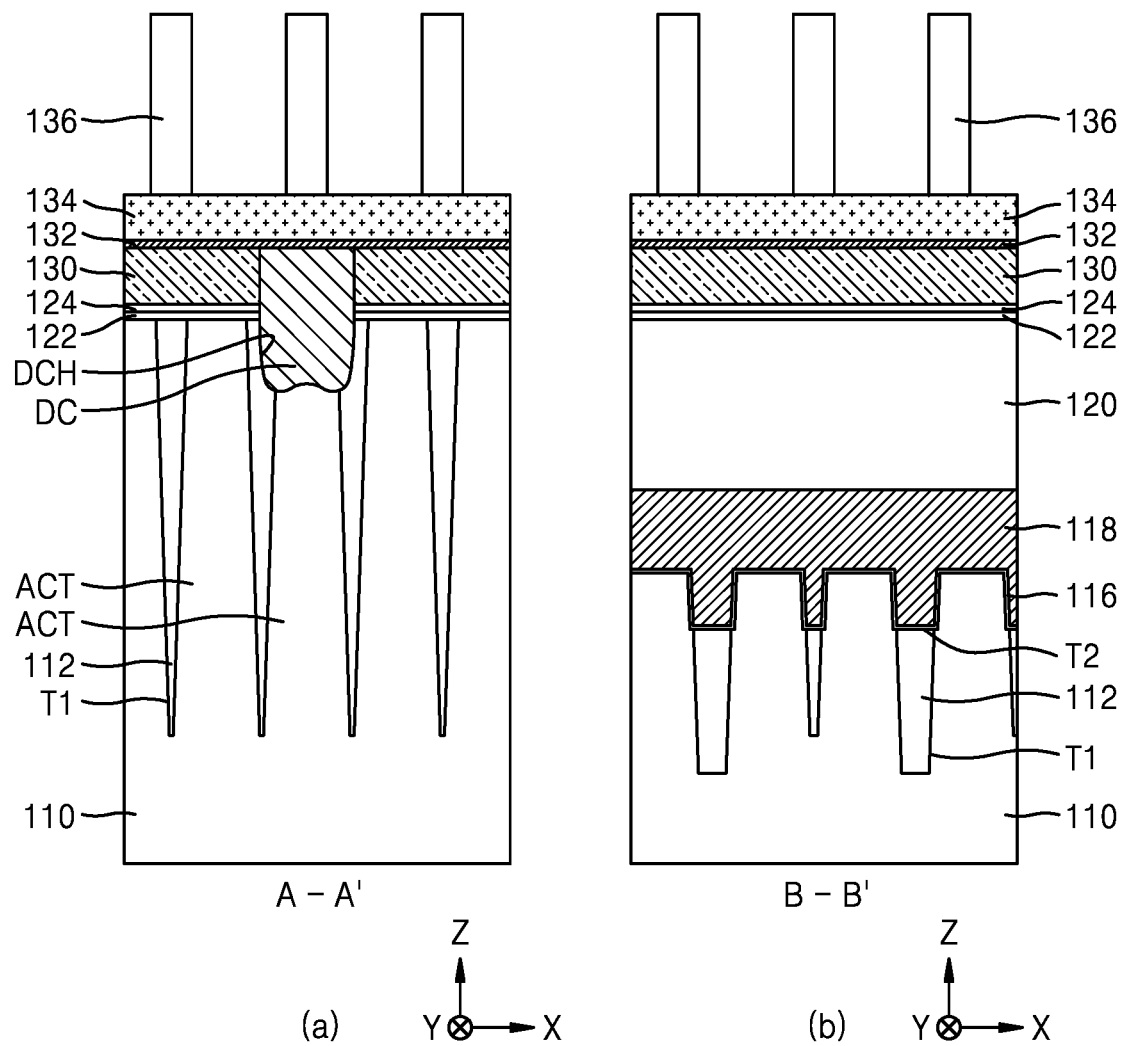

Referring to FIG. 11, on the lower conductive layer 130 and the direct contact DC, the intermediate conductive layer 132, the upper conductive layer 134, and the plurality of insulation capping patterns 136 are sequentially formed.

The plurality of insulation capping patterns 136 may be formed of line patterns that longitudinally extend in the second horizontal direction (the Y direction). The intermediate conductive layer 132 and the upper conductive layer 134 may be formed of TiN, TiSiN, W, tungsten silicide, or a combination thereof. In some embodiments, the intermediate conductive layer 132 may include TiSiN and the upper conductive layer 134 may include W. The plurality of insulation capping patterns 136 may be formed of a silicon nitride.

Figure 12:
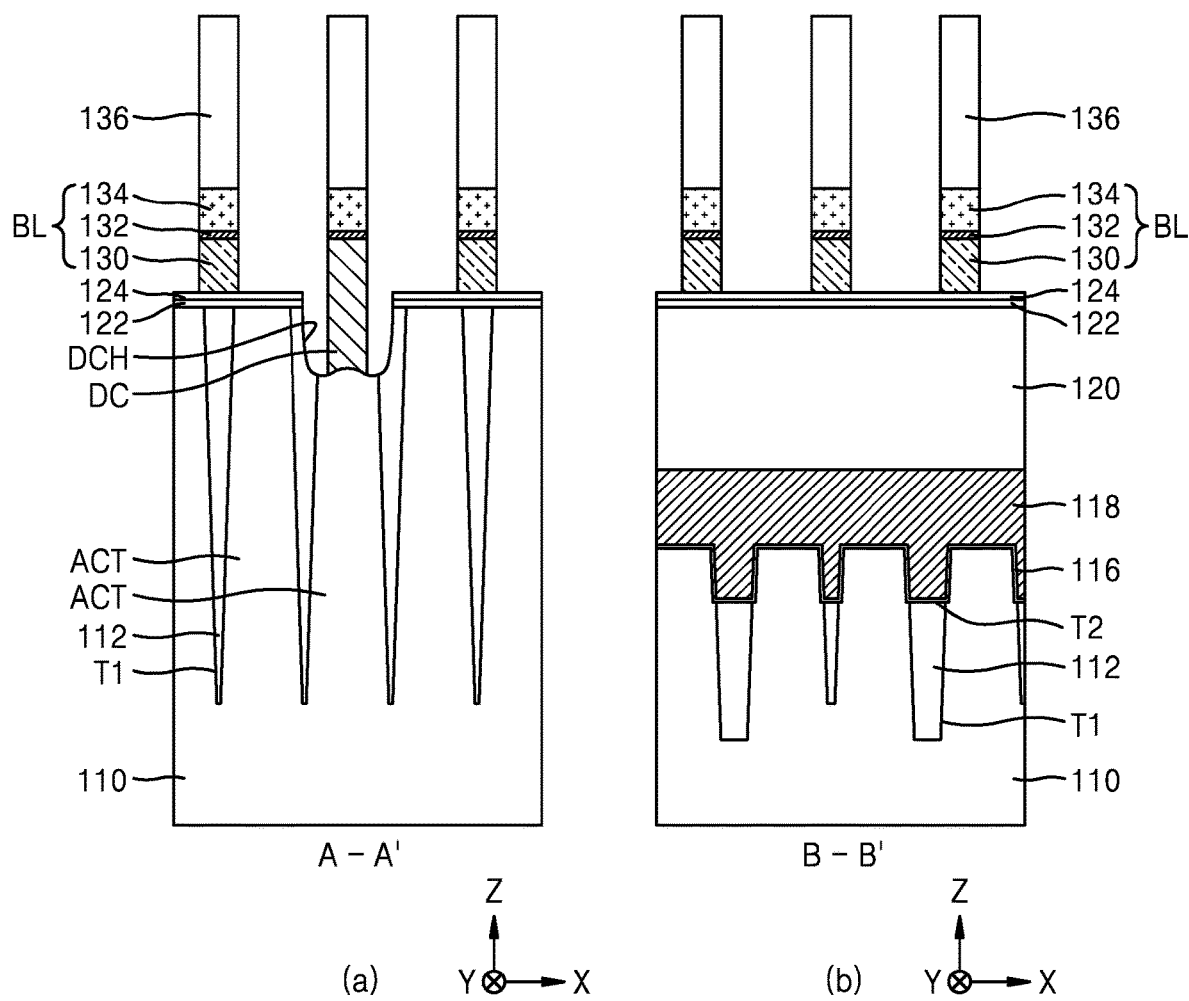

Referring to FIG. 12, by etching parts of the upper conductive layer 134, the intermediate conductive layer 132, the lower conductive layer 130, and the direct contact DC under the plurality of insulation capping patterns 136 by using the plurality of insulation capping patterns 136 as an etching mask, the plurality of bit lines BL formed of left portions of the lower conductive layer 130, the intermediate conductive layer 132, and the upper conductive layer 134 are formed on the substrate 110 and a part of the direct contact hole DCH is exposed again around the direct contact DC.

Figure 13A:
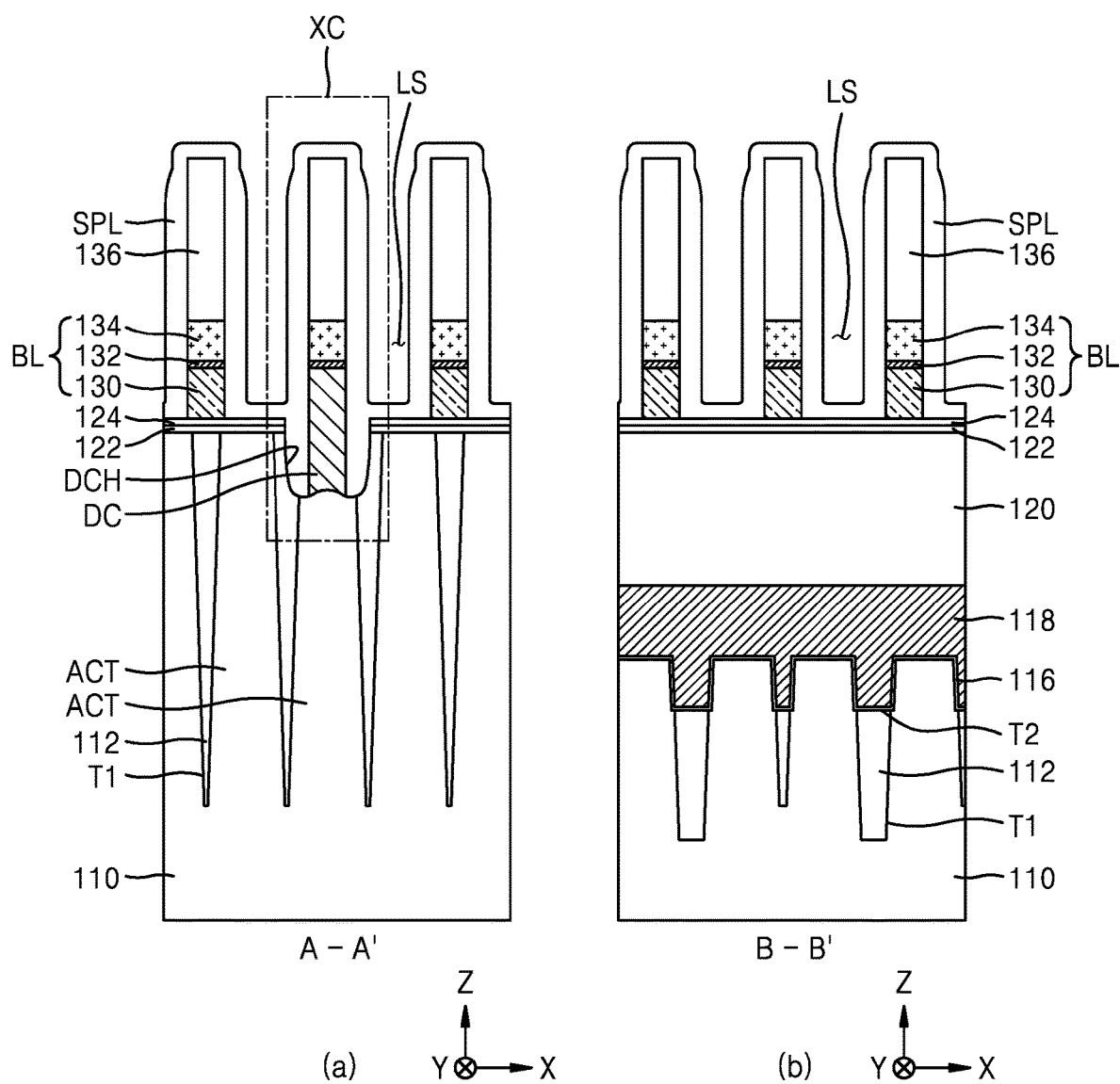
Figure 13B:
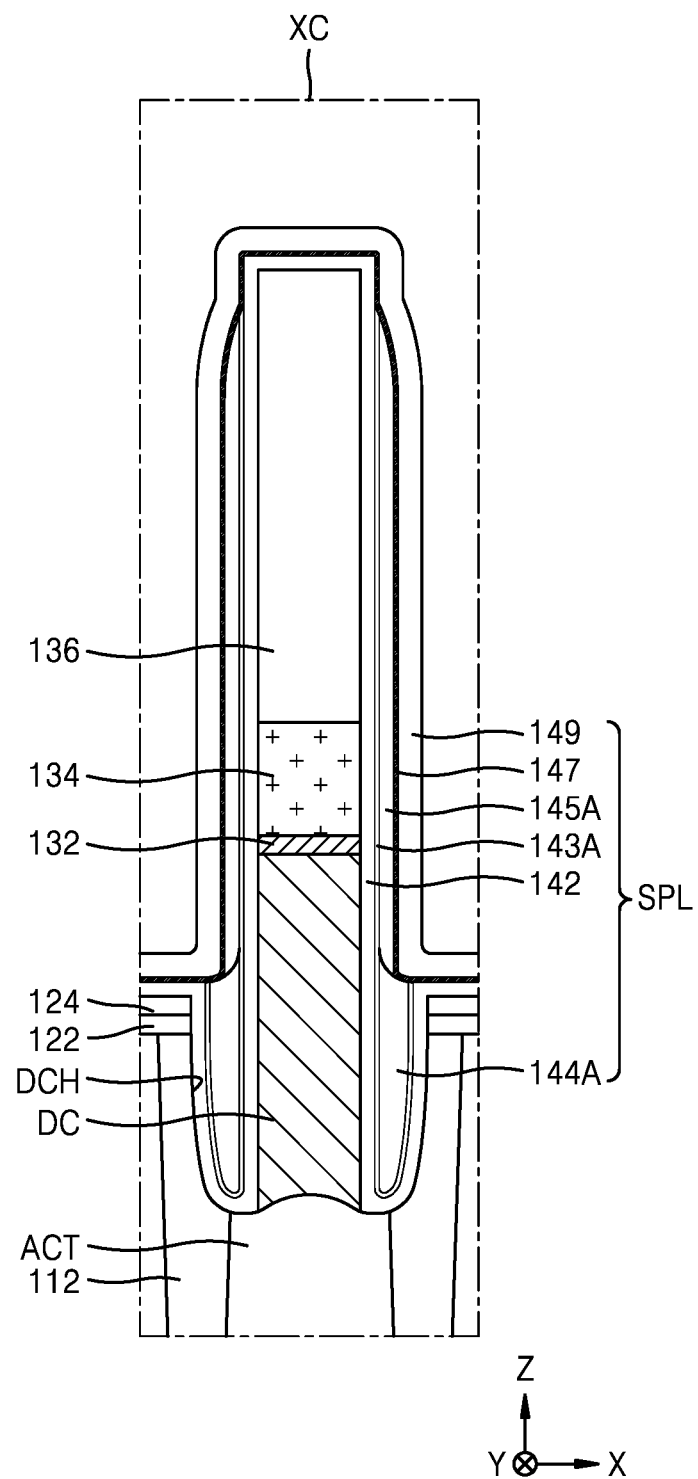

Referring to FIGS. 13A and 13B, the plurality of bit lines BL, the plurality of insulation capping patterns 136, and a plurality of multilayer insulating spacers SPC that cover side walls of the plurality of direct contacts DC are formed. The plurality of multilayer insulating spacers SPC may fill empty spaces of the plurality of direct contact holes DCH.

FIGS. 20A to 20H are cross-sectional views illustrating enlargements of elements in order to describe, in the order of processes, exemplary processes for forming the multilayer insulating spacer SPC illustrated in FIGS. 13A and 13B. In FIGS. 20A to 20H, illustrated are elements of a region corresponding to a dotted line region XC in FIG. 13A.

Figure 20A:
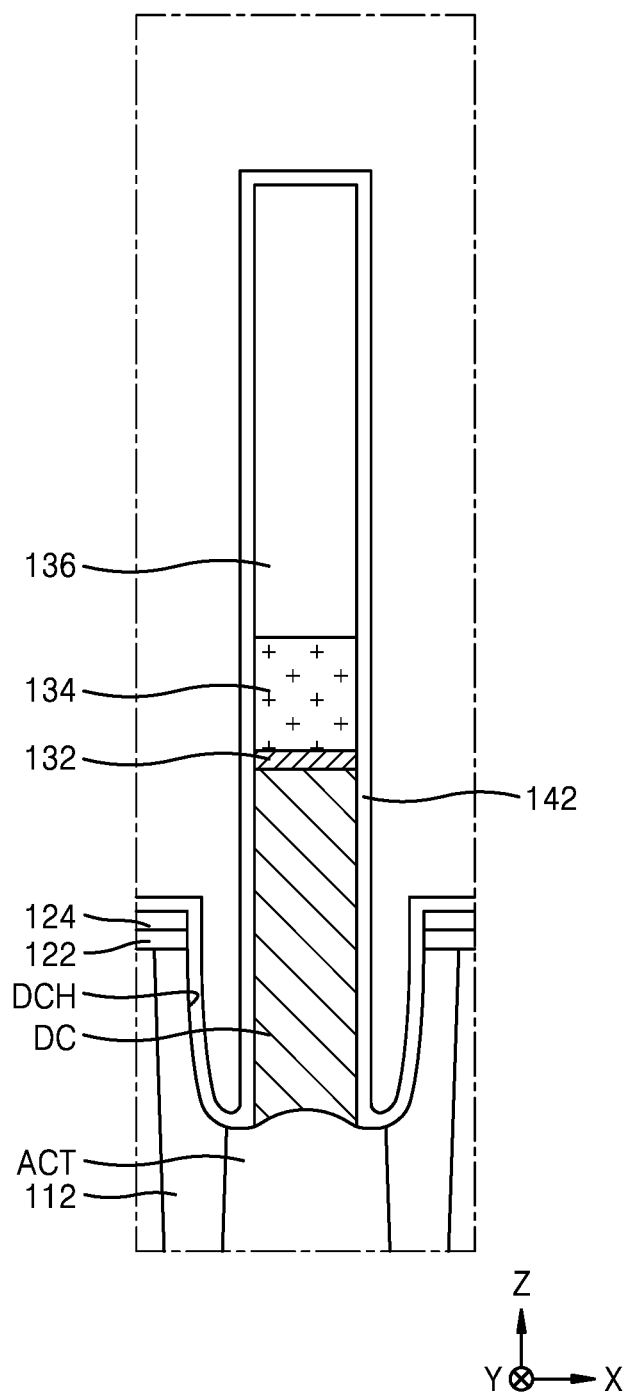
FIGS. 20A to 20H are cross-sectional views illustrating an enlargement of the multilayer insulating spacer illustrated in FIGS. 13A and 13B in the order of processes in order to describe exemplary processes for forming the multilayer insulating spacer.

Referring to FIG. 20A, as illustrated with reference to FIG. 12, after forming the plurality of bit lines BL and exposing a part of the direct contact hole DCH around the direct contact DC, the insulating liner 142 that conformally covers the side walls of the plurality of bit lines BL, the exposed surface of the insulation capping pattern 136, the exposed surface of the direct contact DC, and an inner wall of the direct contact hole DCH is formed. The insulating liner 142 may include a silicon nitride layer.

Figure 20B:
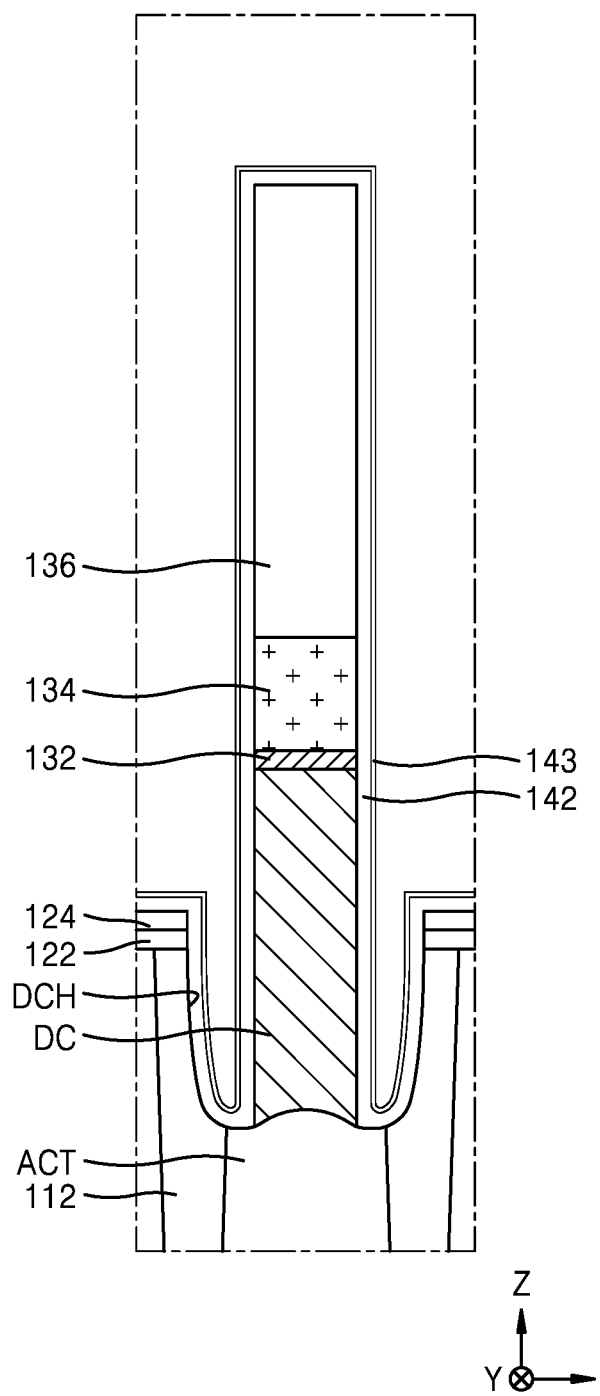

Referring to FIG. 20B, an inner spacer layer 143 is conformally formed on the insulating liner 142. The inner spacer layer 143 may be formed of a material having etching selectivity with respect to the insulating liner 142. For example, the inner spacer layer 143 may include a silicon oxide layer. The inner spacer layer 143 may be formed to a thickness less than that of the insulating liner 142.

In order to form the inner spacer layer 143, an atomic layer deposition (ALD) process or a chemical vapor deposition (CVD) process may be used. In some embodiments, a deposition process for forming the inner spacer layer 143 may be performed at a low temperature in a range of about 25° C. to about 80° C. By forming the inner spacer layer 143 at the low temperature, an undesired mixed material layer is not formed on an interface between the insulating liner 142 and the inner spacer layer 143 formed of different materials and a stable interface state may be maintained.

Figure 20C:
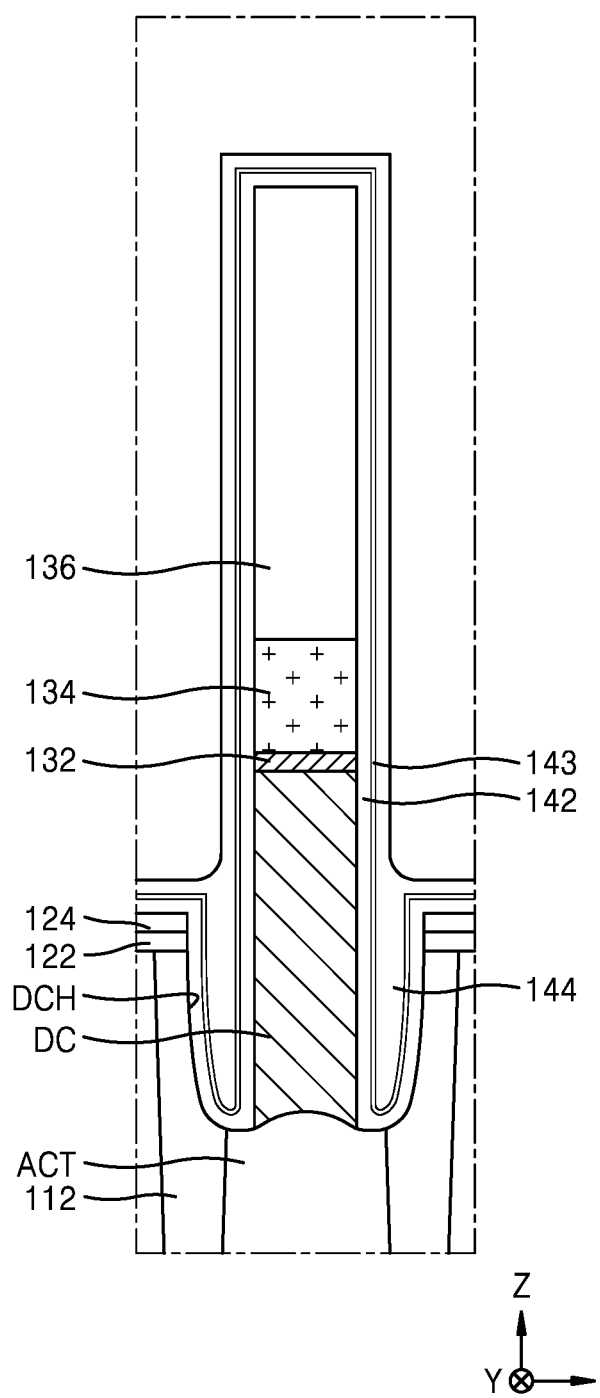

Referring to FIG. 20C, a buried spacer layer 144 is conformally formed on the inner spacer layer 143. The buried spacer layer 144 may fill the remaining space in the direct contact hole DCH. The buried spacer layer 144 may be formed of a material having etching selectivity with respect to the inner spacer layer 143. For example, the buried spacer layer 144 may include a silicon nitride layer.

Figure 20D:
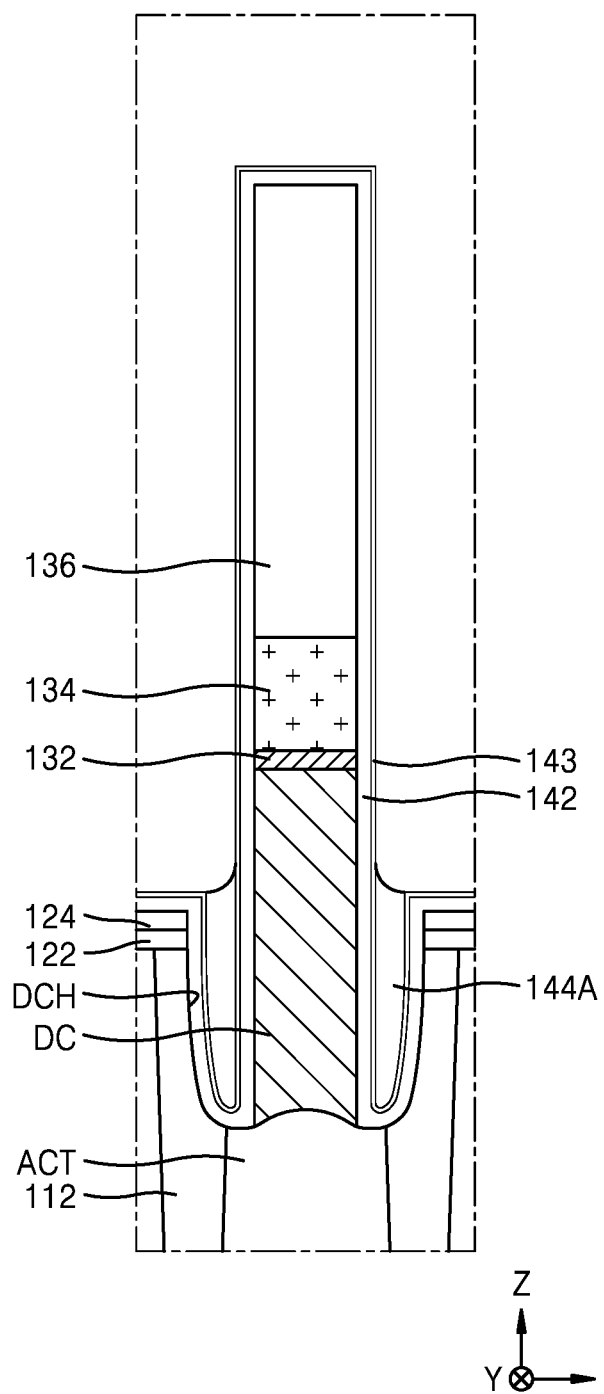

Referring to FIG. 20D, the buried spacer layer 144 is isotropically etched from the resultant structure of FIG. 20C to form a buried spacer 144A formed of the remaining portion of the buried spacer layer 144. The buried spacer 144A may include a portion that fills the inside of the direct contact hole DCH and a portion that covers the entrance of the direct contact hole DCH outside the direct contact hole DCH.

In some embodiments, an isotropic etching process of the buried spacer layer 144 may be performed by using a phosphoric acid. During a time when the isotropic etching process is performed, the inner spacer layer 143 may function as an etching stop layer for the isotropic etching process.

Figure 20E:
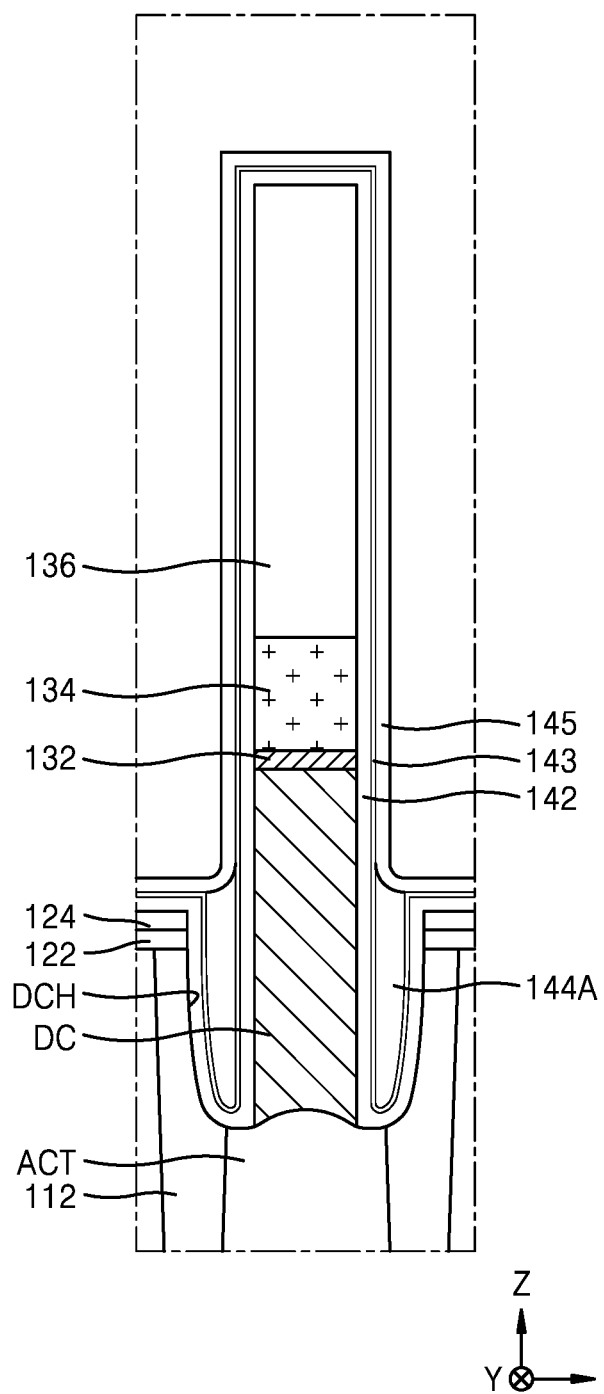

Referring to FIG. 20E, a middle spacer layer 145 that conformally covers exposed surfaces of the inner spacer layer 143 and the buried spacer 144A is formed.

The middle spacer layer 145 may be formed of a material having etching selectivity with respect to the buried spacer 144A. The middle spacer layer 145 may be formed of the same material as that of the inner spacer layer 143. For example, the middle spacer layer 145 may include a silicon oxide layer.

In order to form the middle spacer layer 145, the ALD process or the CVD process may be used. In some embodiments, a deposition process for forming the middle spacer layer 145 may be performed at a low temperature in the range of about 25° C. to about 80° C. By forming the middle spacer layer 145 at the low temperature, during a time when the middle spacer layer 145 is formed, the undesired mixed material layer is not formed on the interface between the insulating liner 142 and the inner spacer layer 143 and the stable interface state may be maintained.

Figure 20F:
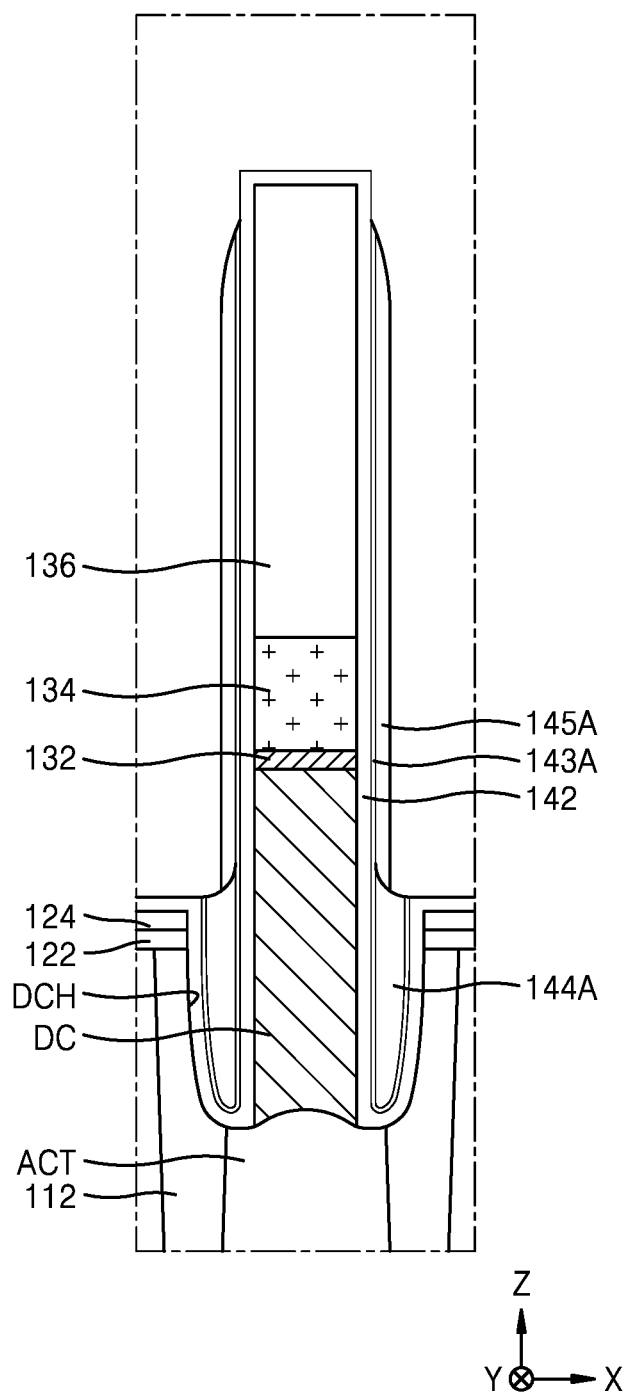

Referring to FIG. 20F, by removing parts of the middle spacer layer 145 and the inner spacer layer 143 by using an anisotropic etching process, an inner spacer 143A and a middle spacer 145A that sequentially cover the insulating liner 142 on the opposite side walls of the plurality of bit lines BL are formed. After forming the inner spacer 143A and the middle spacer 145A, a part of the insulating liner 142 that covers an upper portion of the insulation capping pattern 136 and a part of the buried spacer 144a that fills the direct contact hole DCH may be exposed.

Figure 20G:
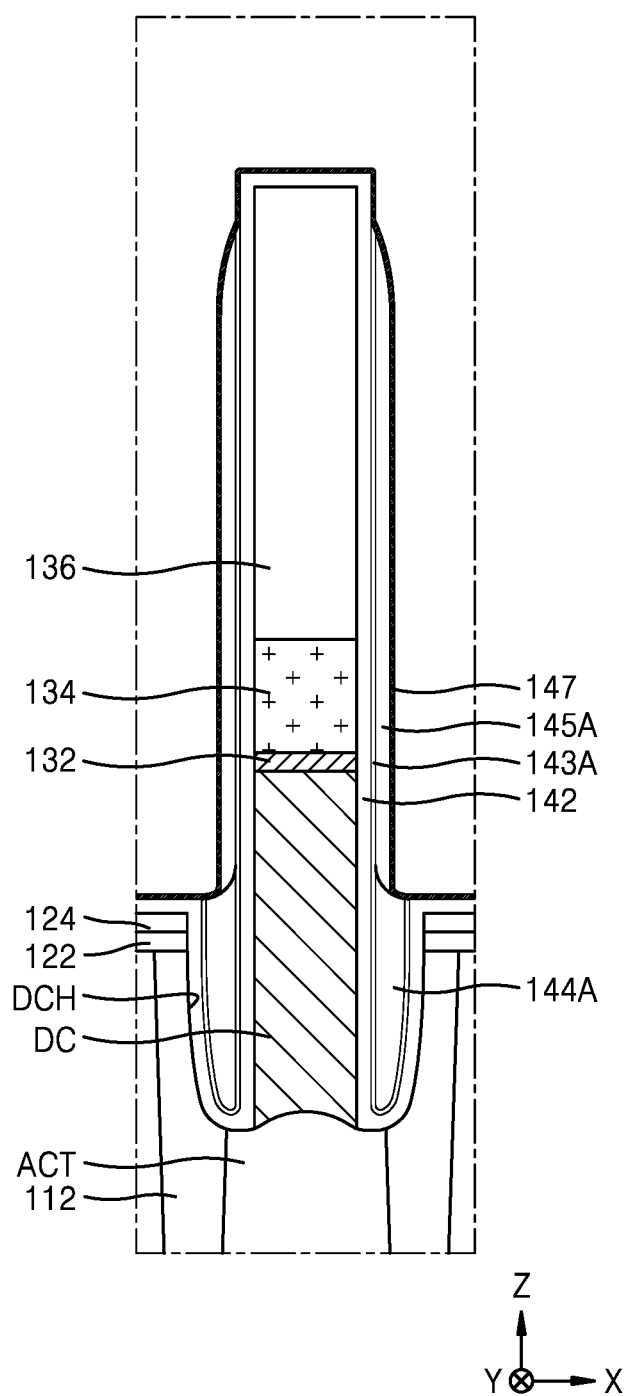

Referring to FIG. 20G, an outer barrier layer 147 that conformally covers the resultant material of FIG. 20F in which the inner spacer 143A and the middle spacer 145A are formed is formed.

In some embodiments, in order to form the outer barrier layer 147, a monomolecular layer formed of a two-dimensional material or a plurality of monomolecular layers each formed of the two-dimensional material may be formed.

In other embodiments, the outer barrier layer 147 may include a SiC layer or a SiCN layer.

In order to form the outer barrier layer 147, an ALD process, a CVD process, a metal organic CVD (MOCVD) process, a low pressure CVD (LPCVD) process, a plasma enhanced CVD (PECVD) process, or a molecular beam epitaxy (MBE) process may be used. For example, in order to form the outer barrier layer 147 formed of h-BN, an LPCVD process or an MBE process may be used.

In some embodiments, in order to form the outer barrier layer 147 formed of h-BN, $B_2H_6$, $BCl_3$, $BF_3$, or a solution of $BH_3$ in tetrahydrofuran (THF) (THF-$BH_3$) may be used as a boron source. In order to form the outer barrier layer 147 formed of h-BN, nitrogen, $N_2H_4$, or ammonia may be used as a nitrogen source. In other embodiments, in order to form the outer barrier layer 147 formed of h-BN, a gas including a nitrogen atom and a hydrogen atom may be used. $B_3H_6N_3$, $H_3B_3Cl_3N_3$, $BH_2NH_2$, $BH_3$—$NH_3$, $H_3N$—$BH_3$, $B_3N_3H_6$, $[(NH_3)_2BH_2]^+[BH_4]^-$, BN, or a polymer composite (polyborazylene) may be used as the gas including the nitrogen atom and the hydrogen atom.

In some embodiments, the outer barrier layer 147 may be directly formed on the resultant material of FIG. 20F in which the inner spacer 143A and the middle spacer 145A are formed.

In other embodiments, after forming a two-dimensional material layer to be used for forming the outer barrier layer 147 on a separate substrate, the two-dimensional material layer may be stacked or attached onto the resultant material of FIG. 20F in which the inner spacer 143A and the middle spacer 145A are formed.

Figure 20H:
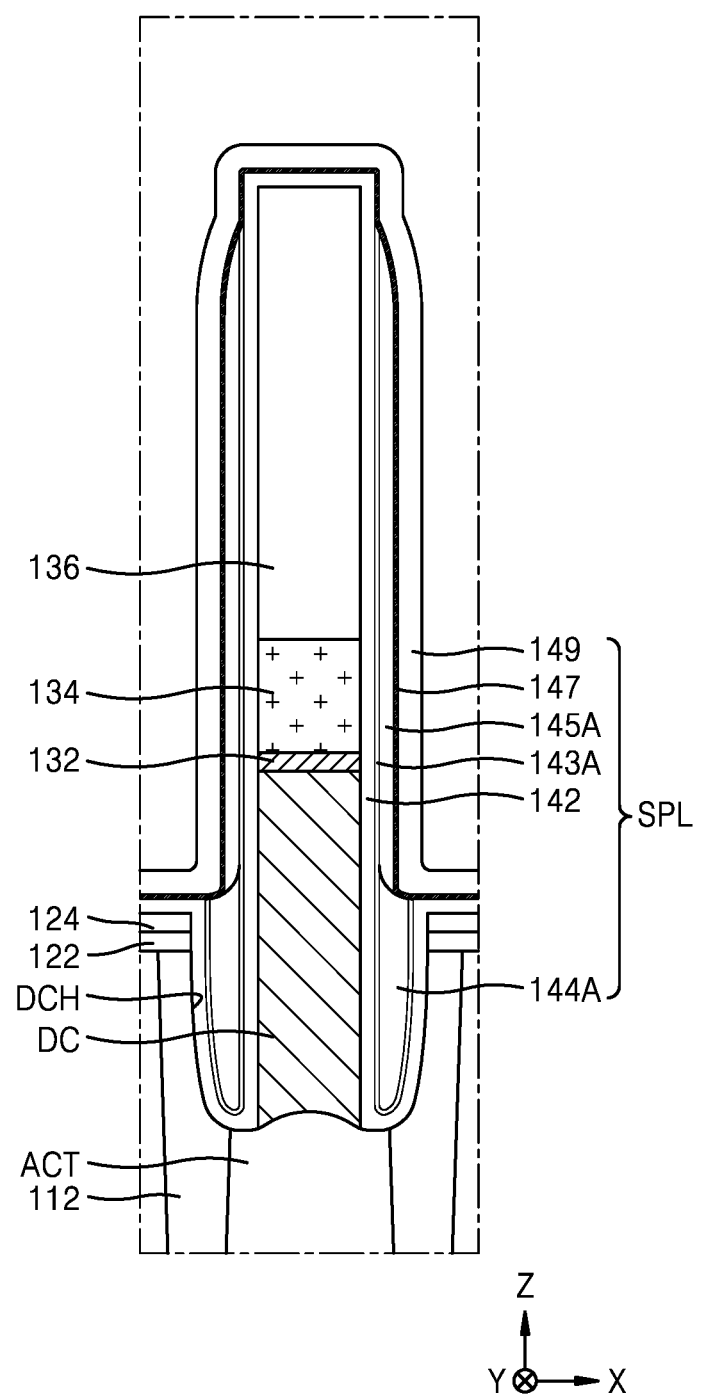

Referring to FIG. 20H, on the resultant material of FIG. 20G, the outer spacer 149 that conformally covers the outer barrier layer 147 is formed.

In some embodiments, the outer spacer 149 may be formed of a material having etching selectivity with respect to the middle spacer 145A and the outer barrier layer 147. For example, the outer spacer 149 may include a silicon nitride layer or a silicon nitride layer doped with at least one of an oxygen atom (O) and a carbon atom (C).

In order to form the outer spacer 149, the ALD process or the CVD process may be used. In some embodiments, a deposition process for forming the outer spacer 149 may be performed at a high temperature in a range of about 500° C. to about 700° C. When the deposition process for forming the outer spacer 149 is performed at the high temperature, since the outer spacer 149 is spaced apart from the middle spacer layer 145 with the outer barrier layer 147 interposed, while the outer spacer 149 is formed, it is possible for the outer barrier layer 147 to effectively prevent oxygen atoms (O) that form the middle spacer layer 145 from diffusing into the outer spacer 149. Therefore, it is possible to prevent the mixed material layer from being formed between the middle spacer layer 145 and the outer spacer 149 due to diffusion of oxygen. Therefore, it is possible to prevent a thickness of the outer spacer 149 in the first horizontal direction (the X direction) from being reduced.

The insulating liner 142, the buried spacer 144A, the inner spacer 143A, the middle spacer 145A, the outer barrier layer 147, and the outer spacer 149 may form a multilayer insulating spacer layer SPL.

Referring to FIGS. 13A and 13B again, after the multilayer insulating spacer SPL is formed, on the second insulating layer 124, line spaces LS may extend, in the second horizontal direction (the Y direction), among a plurality of bit line structures including the plurality of bit lines BL and the plurality of insulation capping patterns 136. For example, the line spaces LS may be defined, between two adjacent bit line structures, by the multilayer insulating spacer layer SPL.

Figure 14:
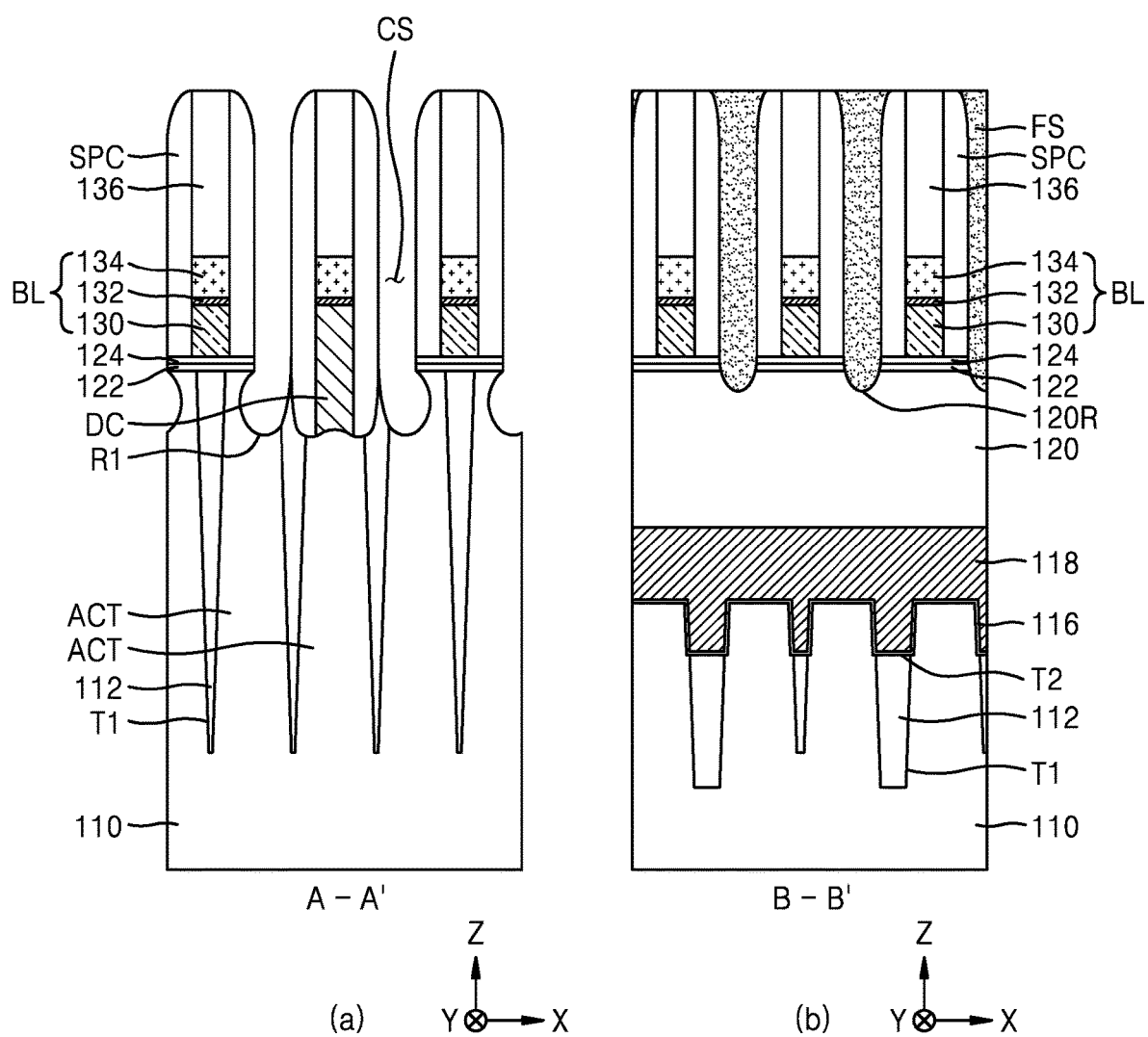

Referring to FIG. 14, the multilayer insulating spacers SPC may be formed by performing an anisotropic etching process such as a reactive ion etching process on the multilayer insulating spacer layer SPL. Each of the line spaces LS may be divided into a plurality of pillar-shaped contact spaces CS by forming the plurality of insulating fences FS in the line spaces LS between two adjacent bit lines of the plurality of bit lines BL. In an example embodiment, the insulating fences FS may be spaced apart from each other in the second horizontal direction (the Y-direction). The active regions ACT exposed through the plurality of contact spaces CS may be recessed, through the pillar-shaped contact spaces CS, to form a plurality of second recess spaces R1 on the substrate 110 and among the plurality of bit lines BL.

The plurality of insulating fences FS may be in the form of insulating plugs that vertically overlap the word lines 118 on the word lines 118. By the plurality of insulating fences FS, each of the plurality of line spaces LS (FIG. 13A) may be divided into the plurality of pillar-shaped contact spaces CS. In an example embodiment, the pillar-shaped contact spaces CS may be spaced apart from each other in the second horizontal direction (the Y-direction) so that each of the insulating fences FS and each of the pillar-shaped contact spaces CS may be alternately arranged in the second horizontal direction (the Y-direction).

The plurality of insulating fences FS may include a silicon nitride layer. In some embodiments, while forming the plurality of insulating fences FS using an etching process, in the plurality of multilayer insulating spacers SPC and the plurality of insulation capping patterns 136, parts adjacent to the plurality of insulating fences FS are also exposed to the etching process at which the plurality of insulating fences FS are formed and may be partially removed. As a result, heights of partial regions of the plurality of multilayer insulating spacers SPC and the plurality of insulation capping patterns 136 may be reduced, and a plurality of first recess spaces 120R may be formed in the upper surfaces of the buried insulating layers 120. The plurality of insulating fences FS may fill the plurality of first recess spaces 120R.

In order to form the plurality of second recess spaces R1 through the plurality of contact spaces CS, anisotropic etching, isotropic etching, or a combination of the anisotropic etching and the isotropic etching may be used. For example, in the structures exposed through the plurality of contact spaces CS among the plurality of bit lines BL, by sequentially etching the second insulating layer 124 and the first insulating layer 122 by an anisotropic etching process and removing parts of the plurality of active regions ACT of the substrate 110 exposed by etching the first insulating layer 122 by an isotropic etching process, the plurality of second recess spaces R1 may be formed. The plurality of second recess spaces R1 may be respectively connected to the plurality of contact spaces CS. Through the plurality of second recess spaces R1, the plurality of active regions ACT of the substrate 110 may be exposed.

Figure 15:
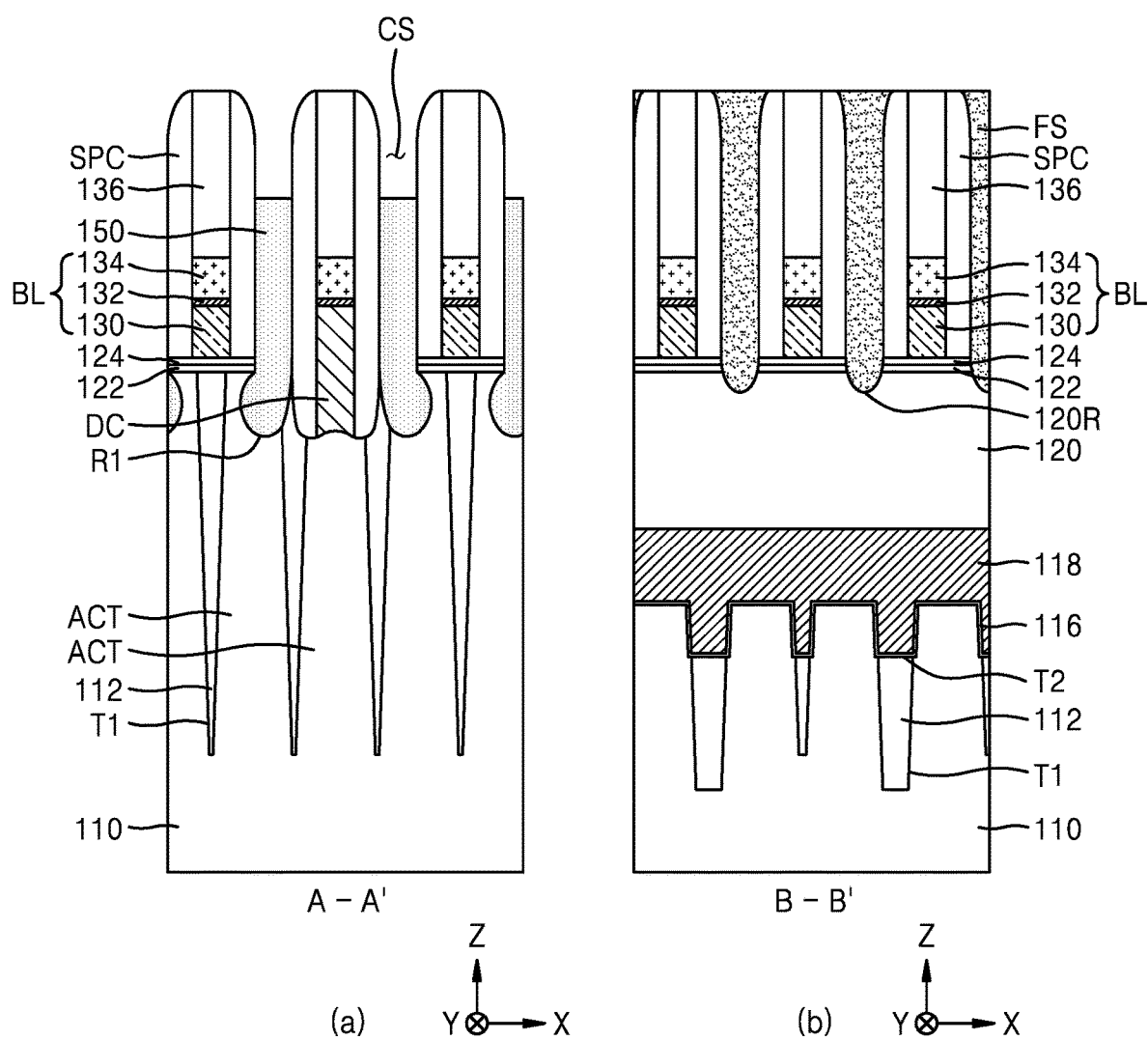

Referring to FIG. 15, the plurality of conductive plugs 150 that fill parts of the plurality of contact spaces CS between each of the plurality of bit lines BL and the plurality of second recess spaces R1 between each of the plurality of bit lines BL are formed.

In order to form the plurality of conductive plugs 150, after forming a conductive layer that covers upper surfaces of the plurality of insulation capping patterns 136 and the plurality of insulating fences FS while filling the plurality of second recess spaces R1 and the plurality of contact spaces CS in the resultant material of FIG. 14, an etch back process may be performed to remove an upper part of the conductive layer. In the etch back process, the upper surfaces of the plurality of insulation capping patterns 136 and the plurality of insulating fences FS may be exposed, and the conductive layer may be recessed so that entrances of the plurality of contact spaces CS may be exposed and the upper surfaces of the conductive plugs 150 are in contact with side walls of the multilayer insulating spacers SPC. In the conductive layer, parts that are left without being removed may form the plurality of conductive plugs 150.

The plurality of conductive plugs 150 may form at least parts of the plurality of buried contacts BC illustrated in FIG. 1. The plurality of conductive plugs 150 may be formed of doped polysilicon.

Figure 16:
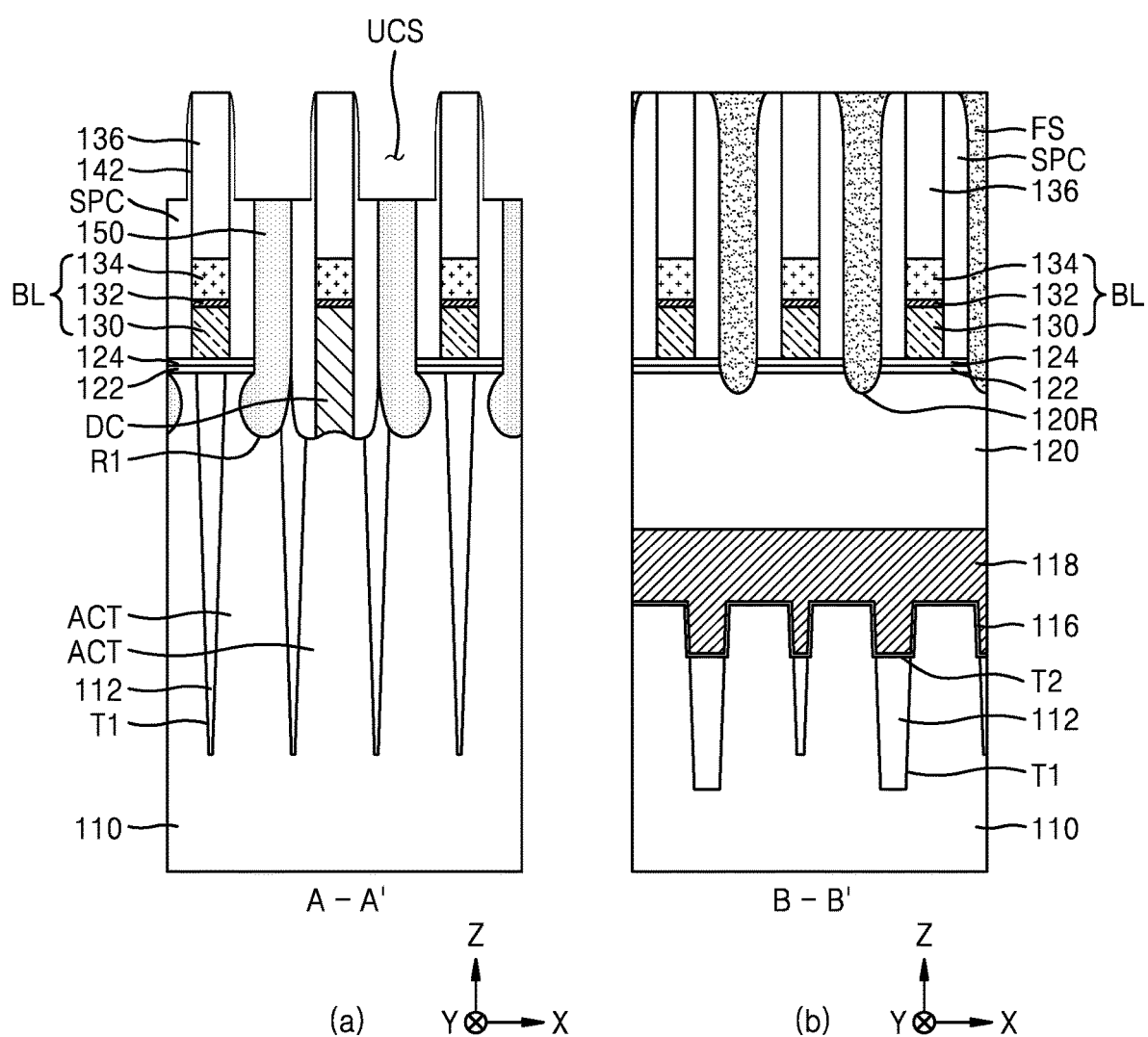

Referring to FIG. 16, by removing parts of the plurality of multilayer insulating spacers SPC exposed through the upper spaces at the entrances of the plurality of contact spaces CS (refer to FIG. 15), a width of the plurality of contact spaces CS increases at opposite sides among the plurality of insulation capping patterns 136 in a lengthwise direction (i.e., the X direction) of the word lines 118 and accordingly, a plurality of upper contact spaces UCS are formed. Each of the upper contact spaces UCS may has a width greater than a width of each of the contact spaces CS. In the first horizontal direction (the X direction), the width of each of the plurality of upper contact spaces UCS may be greater than that of each of the plurality of conductive plugs 150.

In order to form the plurality of upper contact spaces UCS, at least parts of the plurality of multilayer insulating spacers SPC may be etched. In an example embodiment, the parts of the plurality of multilayer insulating spacers SPC may be removed by an isotropic etching process such as a wet etching process. For example, from the plurality of multilayer insulating spacers SPC exposed on the plurality of conductive plugs 150, by removing a part of the outer spacer 149, a part of the outer barrier layer 147, a part of the middle spacer 145A, and a part of the inner spacer 143A that are illustrated in FIG. 13B by wet etching, in the plurality of upper contact spaces UCS, the insulating liner 142 may be exposed. Among inner side walls of the plurality of upper contact spaces UCS, in a pair of inner side walls that face each other in the first horizontal direction (the X direction), a pair of insulating liners 142 are exposed and, in a pair of inner side walls that face each other in the second horizontal direction (the Y direction), a pair of insulating fences FS may be exposed.

In the plurality of upper contact spaces UCS, on opposite side walls of each of the plurality of insulation capping patterns 136, in the multilayer insulating spacer SPC, only the insulating liner 142 is left. In the first horizontal direction (the X direction), on opposite side walls of each of the plurality of conductive plugs 150 and on opposite side walls of each of the plurality of insulating fences FS, the multilayer insulating spacers SPC may remain without being etched during a time when the upper contact spaces UCS are formed.

Figure 17:
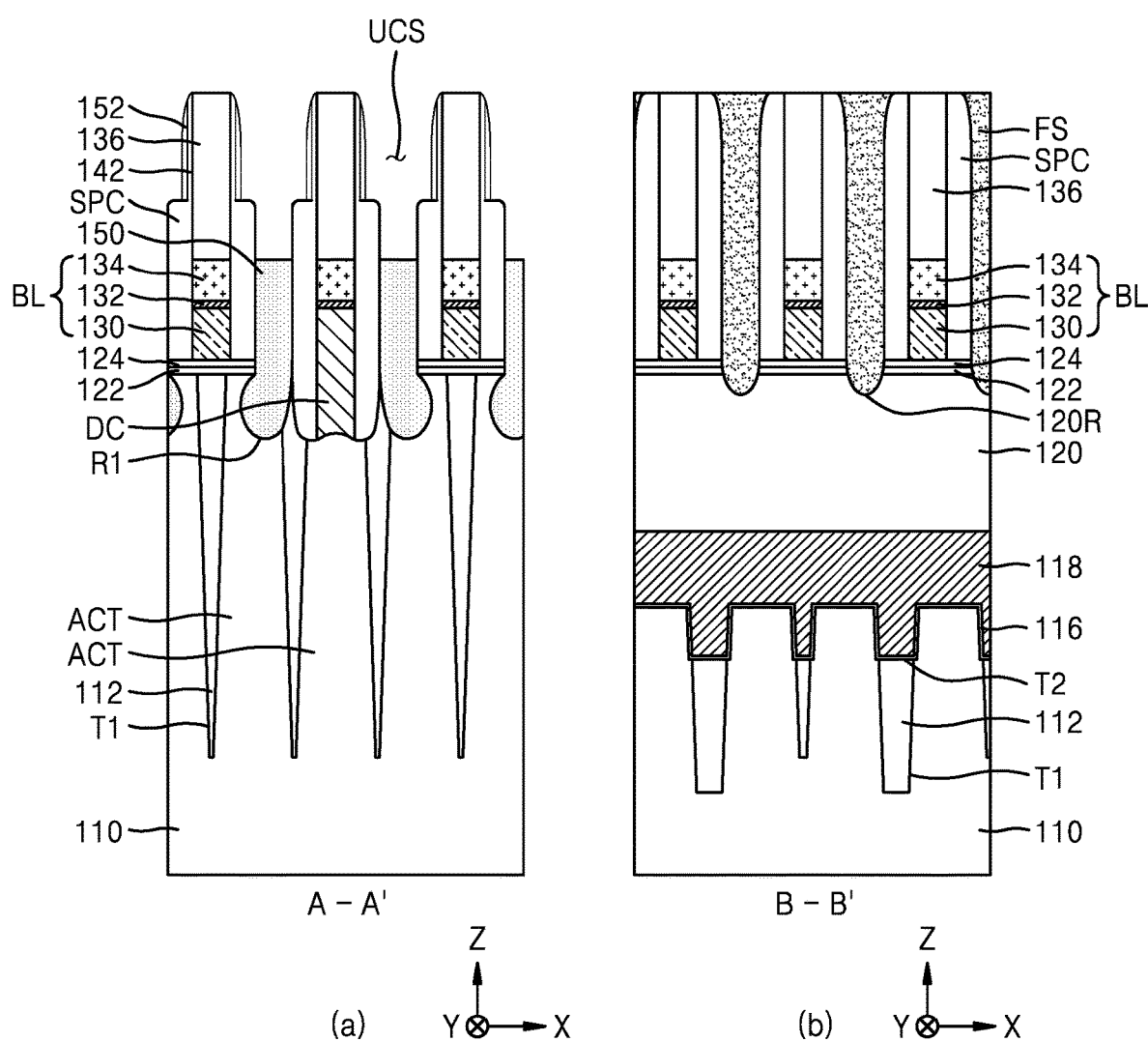

Referring to FIG. 17, on inner side walls of the plurality of upper contact spaces UCS, a plurality of upper insulating spacers 152 that cover side walls, spaced apart from each other in the first horizontal direction (the X-direction), of the plurality of insulating liners 142 and side walls, spaced apart from each other in the second horizontal direction (the Y-direction), of the plurality of insulating fences FS that are exposed are formed.

In order to form the plurality of upper insulating spacers 152, after forming an insulating layer that conformally covers an entire surface of the resultant material of FIG. 16, the insulating layer may be etched back. During a time when a process of etching back the insulating layer is performed, the upper surfaces of the plurality of conductive plugs 150 may be exposed to the etch back process. As a result, the upper surfaces of the plurality of conductive plugs 150 may be recessed so that heights of the plurality of conductive plugs 150 may be reduced. The plurality of upper insulating spacers 152 may include a silicon nitride layer.

Figure 18A:
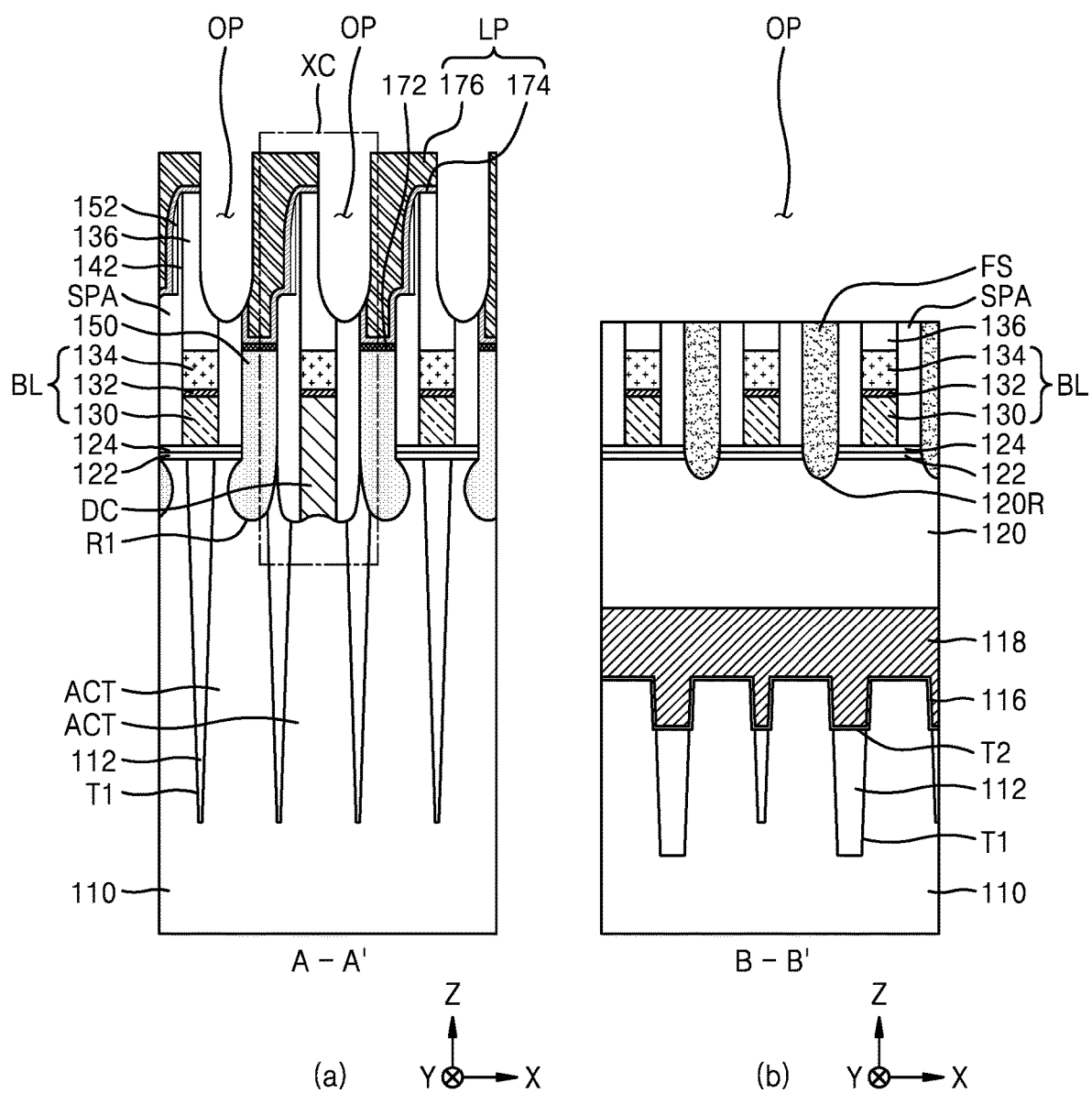
Figure 18B:
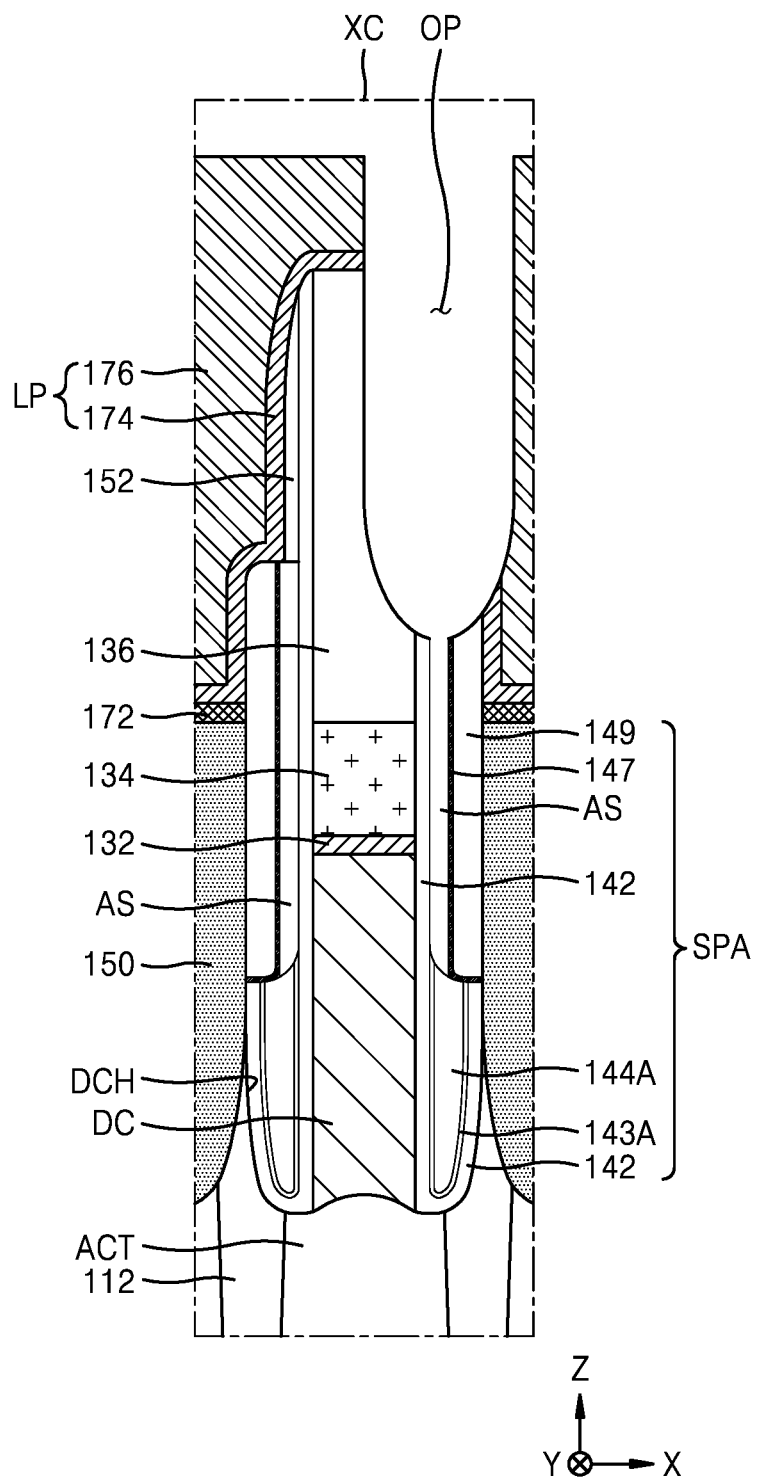

Referring to FIGS. 18A and 18B, a preliminary metal silicide layer and a conductive landing pad layer may be formed on the resultant structure of FIG. 17 including the plurality of conductive plugs 150 exposed through the plurality of upper contact spaces UCS (refer to FIG. 17). The combined structure of the preliminary metal silicide layer and the conductive landing pad layer may fill the plurality of upper contact spaces UCS. A plurality of insulating spaces OP may be formed in the combined structure to separate the preliminary metal silicide layer and the conductive landing pad layer into a plurality of metal silicide layers 172 and a plurality of conductive landing pads LP, respectively. The plurality of conductive landing pads LP may be formed to be connected to the plurality of conductive plugs 150 through the metal silicide layers 172. Then, by selectively removing the inner spacer 143A and the middle spacer 145A from the plurality of multilayer insulating spacers SPC exposed through the insulating spaces OP, the air spacers AS are formed. As a result, the plurality of insulating spacers SPA including the air spacers AS may be formed. The air spacers AS of the plurality of insulating spacers SPA may be connected to the insulating spaces OP.

The plurality of conductive landing pads LP may extend to upper portions of the insulation capping patterns 136 to vertically overlap parts of the plurality of bit lines BL while filling the plurality of upper contact spaces UCS on the metal silicide layer 172. The plurality of conductive landing pads LP may include the conductive barrier layers 174 and the conductive layers 176 that extend to upper portions of the plurality of bit lines BL while filling the remaining spaces of the upper contact spaces UCS on the conductive barrier layers 174. The conductive barrier layer 174 may be formed of a stack structure of Ti/TiN. The conductive layer 176 may be formed of metal, a metal nitride, doped polysilicon, or a combination thereof. For example, the conductive layer 176 may include W.

In an exemplary process for forming the plurality of conductive landing pads LP, after sequentially forming a preliminary conductive barrier layer and a preliminary conductive layer on the metal silicide layer 172 and forming mask patterns (not shown) that expose parts of the preliminary conductive layer on the conductive barrier layer, by etching the preliminary conductive layer and the preliminary conductive barrier layer by using the mask patterns as an etching mask, the plurality of conductive landing pads LP formed of left portions in the conductive barrier layers 174 and the conductive layers 176 may be formed. After the plurality of conductive landing pads LP are formed, the insulating spaces OP may remain around the plurality of conductive landing pads LP. The mask pattern may include a silicon nitride layer. However, the inventive concept is not limited thereto.

The plurality of conductive landing pads LP may be formed of a plurality of island patterns. For example, the plurality of conductive landing pads LP may be spaced apart from each other. The plurality of conductive landing pads LP may form the plurality of conductive landing pads LP illustrated in FIG. 1. At the etching process atmosphere at which the plurality of conductive landing pads LP are formed, around the plurality of conductive landing pads LP, partial regions of the plurality of insulation capping patterns 136 and the plurality of multilayer insulating spacers SPC that cover the side walls of the plurality of insulation capping patterns 136 are removed, and accordingly, heights of the partial regions of the plurality of insulation capping patterns 136 and the plurality of multilayer insulating spacers SPC may be reduced as shown in (b) of FIG. 18A.

In an exemplary process for forming the plurality of insulating spacers SPA, from the plurality of multilayer insulating spacers SPC exposed through the insulating spaces OP around the plurality of conductive landing pads LP, the inner spacer 143A and the middle spacer 145A may be selectively wet etched. At this time, the insulating liners 142 and the outer barrier layers 147 may be used as an etching stop layer. Therefore, it is possible for the outer barrier layers 147 to effectively prevent an etching solution used during a time when the inner spacer 143A and the middle spacer 145A are selectively wet etched from permeating into surrounding structures, for example, the outer spacers 149. Therefore, during a time when the air spacers AS are formed, it is possible to prevent the surrounding structures, for example, the outer spacers 149, the conductive plugs 150, the metal silicide layer 172, and the conductive landing pads LP from being exposed to the etching solution or being damaged or deformed by the etching solution.

For example, without the outer barrier layer 147, as described above with reference to FIG. 20H, between the middle spacer 145A and the outer spacer 149, during a time when the outer spacer 149 is formed at a high temperature atmosphere, oxygen atoms that form the middle spacer 145A may diffuse into the outer spacer 149 and accordingly, between the middle spacer 145A and the outer spacer 149, a mixed material layer may be formed due to diffusion of oxygen atoms. The mixed material layer may be vulnerable to a wet etching atmosphere at which an oxide layer is etched. Due to the formation of the mixed material layer, a thickness of the outer spacer 149 in the first horizontal direction (the X direction) may be smaller than a targeted thickness of the outer spacer 149. Therefore, when the mixed material layer is formed, like in the processes of FIGS. 18A and 18B, in order to form the air spacer AS, while the inner spacer 143A and the middle spacer 145A that are formed of an oxide layer are selectively wet etched from the plurality of multilayer insulating spacers SPC exposed through the insulating space OP, partial regions of the mixed material layer may also be removed and the outer spacer 149 having a reduced thickness in the first horizontal direction (the X direction) may be easily removed at the wet etching atmosphere and accordingly, through the air spacer AS, the conductive plug 150, the metal silicide layer 172, and the conductive landing pad LP may be exposed or damaged.

According to the inventive concept, since the outer barrier layer 147 is disposed between the middle spacer 145A and the outer spacer 149 during a time when the air spacer AS is formed by selectively wet etching the inner spacer 143A and the middle spacer 145A, it is possible for the outer barrier layer 147 to prevent the etching solution used for the wet etching from affecting the outer spacer 149, the conductive plug 150, the metal silicide layer 172, and the conductive landing pad LP.

Figure 19A:
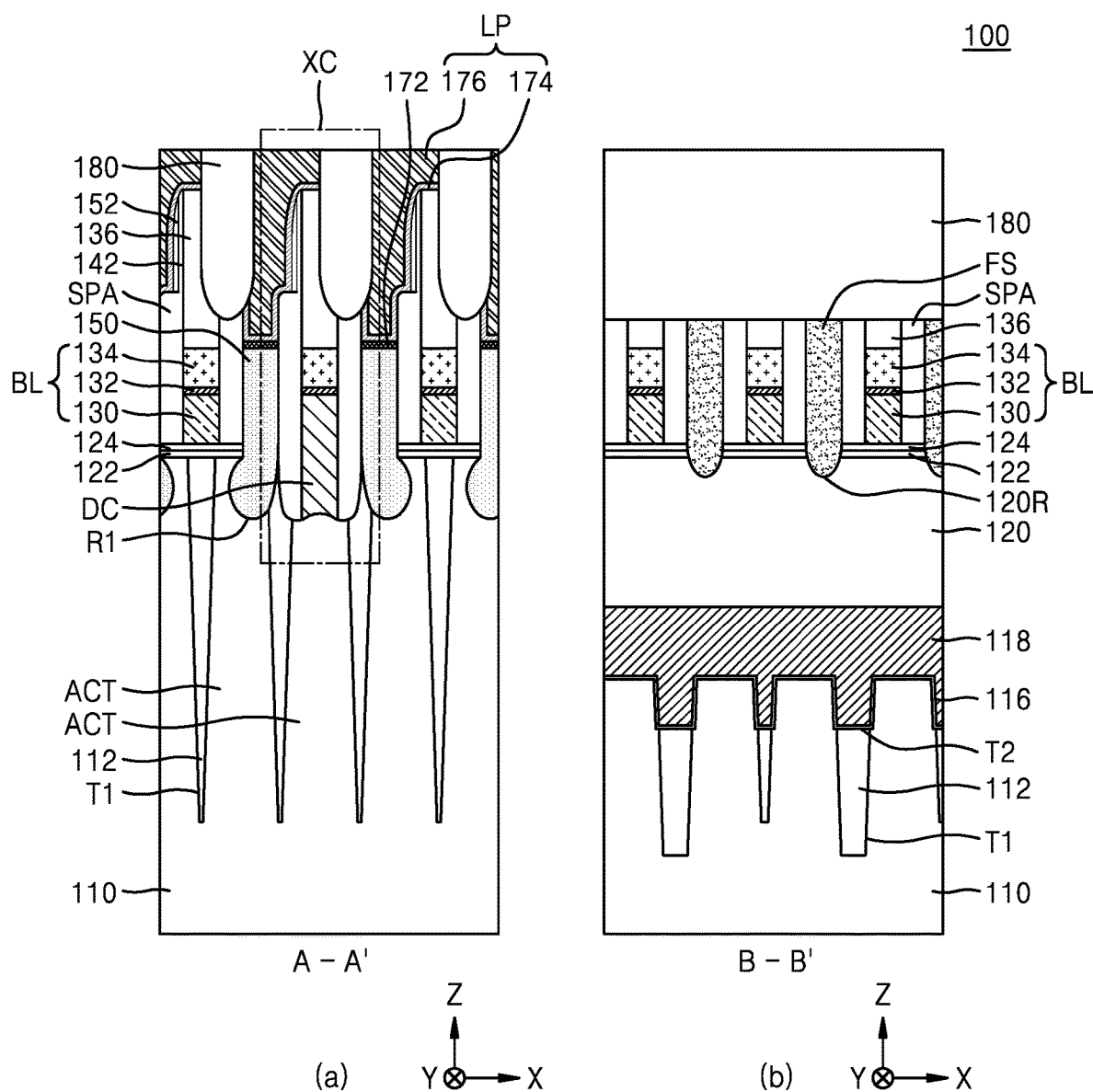
Figure 19B:
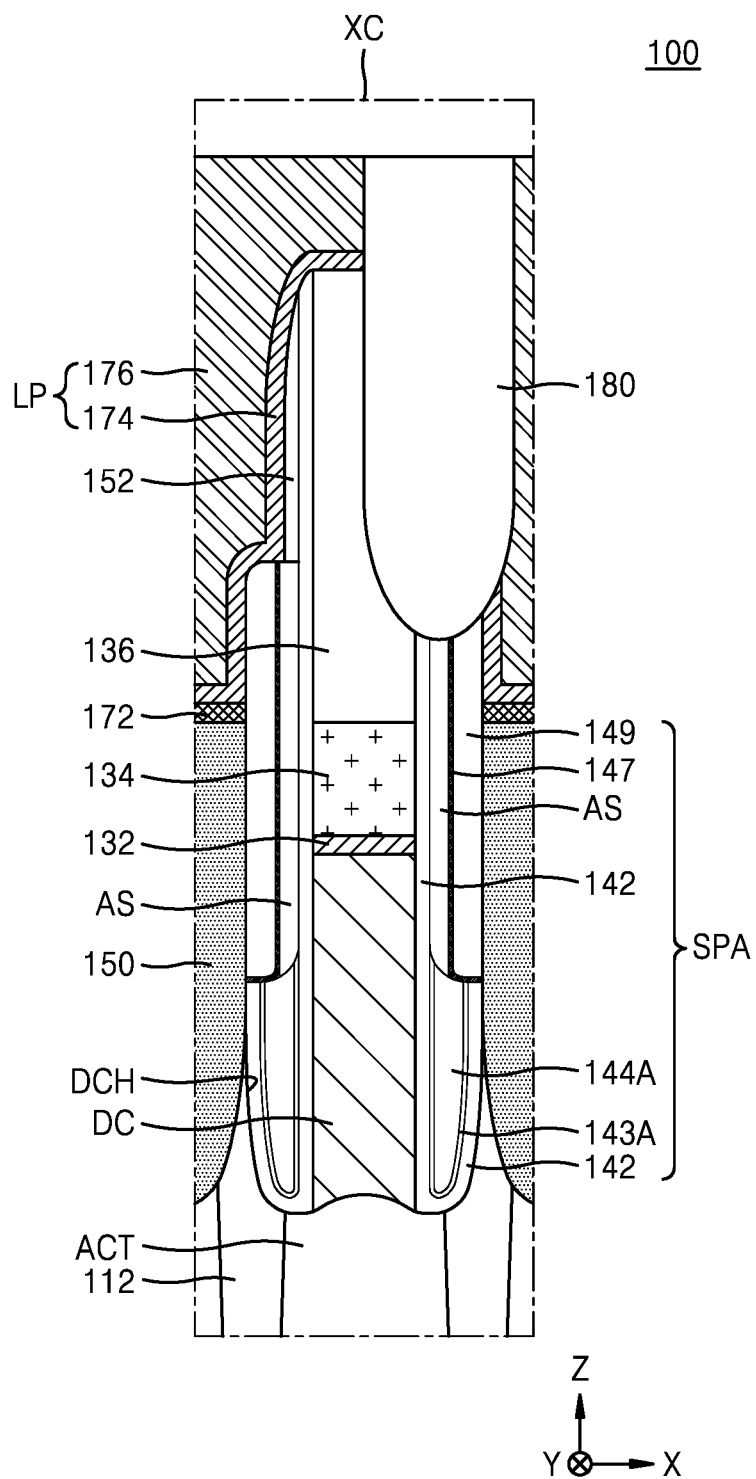

Referring to FIGS. 19A and 19B, by filling the insulating spaces OP with the insulating layer 180 in the resultant material of FIGS. 18A and 18B, the plurality of conductive landing pads LP may be electrically insulated from each other. Then, a plurality of capacitor lower electrodes that may be electrically connected to the plurality of conductive landing pads LP may be formed on the insulating layer 180.

In a method of manufacturing an integrated circuit device according to embodiments of the inventive concept described with reference to FIGS. 7 to 19B, in forming the multilayer insulating spacer SPC, after forming the middle spacer 145A, before forming the outer spacer 149, a process of forming the outer barrier layer 147 that covers the middle spacer 145A is included. Therefore, when a deposition process for forming the outer spacer 149 is performed at a high temperature, since the outer spacer 149 is spaced apart from the middle spacer 145A with the outer barrier layer 147 interposed therebetween, during a time when the outer spacer 149 is formed, it is possible for the outer barrier layer 147 to effectively prevent oxygen atoms that form the middle spacer 145A from diffusing into the outer spacer 149. Therefore, it is possible to prevent the mixed material layer from being formed by diffusion of oxygen atoms from the middle spacer 145A to the outer spacer 149. Therefore, it is possible to prevent the thickness of the outer spacer 149 from being reduced in the first horizontal direction (the X direction). In addition, during a time when the air spacer AS is formed by selectively wet etching the inner spacer 143A and the middle spacer 145A, it is possible to for the outer barrier layer 147 to prevent the etching solution used for the wet etching from affecting the outer spacer 149, the conductive plug 150, the metal silicide layer 172, and the conductive landing pad LP.

The method of manufacturing the integrated circuit device illustrated in FIGS. 2A to 2C is described with reference to FIGS. 7 to 19B and 20A to 20H. However, by description made with reference to FIGS. 7 to 19B in accordance with various modifications and changes within the scope of the inventive concept, those skilled in the art may understand that integrated circuit devices of various structures modified and changed within the scope of the inventive concept may be manufactured. For example, in order to manufacture the integrated circuit device 200 described with reference to FIGS. 5A and 5B, like in the description made with reference to FIGS. 13A and 13B and FIGS. 20A to 20H, the plurality of multilayer insulating spacers SPC may be formed. However, after forming the insulating liner 142 as described with reference to FIG. 20A, and before forming the inner spacer layer 143 as described with reference to FIG. 20B, a process of forming the inner barrier layer 247 may be further included. In order to form the inner barrier layer 247, the same method as the method of forming the outer barrier layer 147 with reference to FIG. 20G may be used. By performing the processes described with reference to FIGS. 20B to 20H and the processes described with reference to FIGS. 14 to 19B on the resultant structure in which the inner barrier layer 247 is formed, the integrated circuit device 200 described with reference to FIGS. 5A and 5B may be manufactured.

While the inventive concept has been particularly shown and described with reference to embodiments thereof, it will be understood that various changes in form and details may be made therein without departing from the spirit and scope of the following claims.

What is claimed is:

1. An integrated circuit device comprising:
    a conductive line formed on a substrate;
    an insulating spacer covering side walls of the conductive line and extending parallel with the conductive line; and
    a conductive plug that is spaced apart from the conductive line with the insulating spacer therebetween,
    wherein the insulating spacer comprises:
    an insulating liner contacting the conductive line;
    an outer spacer contacting the conductive plug; and
    a barrier layer having a first portion between the insulating liner and the outer spacer to prevent oxygen atoms from diffusing into the outer spacer, and
    wherein the barrier layer further includes a second portion which contacts a bottom surface of the outer spacer.

2. The integrated circuit device of claim 1,
    wherein the barrier layer includes a two-dimensional material having a two-dimensional crystalline structure.

3. The integrated circuit device of claim 1, wherein the barrier layer includes SiC, SiCN, or BN.

4. The integrated circuit device of claim 1, wherein the insulating spacer further comprises an air spacer between the insulating liner and the barrier layer.

5. The integrated circuit device of claim 1, wherein the barrier layer has a band gap of at least 1.3 eV.

6. The integrated circuit device of claim 1, wherein the barrier layer includes a monomolecular layer of a two-dimensional material selected from among hexagonal boron nitride (h-BN), GaS, GaSe, phosphorene, $WS_2$, $WSe_2$, $MoS_2$, $MoSe_2$, $ReS_2$, and $ReSe_2$.

7. The integrated circuit device of claim 1, wherein the barrier layer has a thickness of 3 Å to 10 Å in a width direction of the conductive line.

8. An integrated circuit device comprising:
a line structure including a bit line formed on a substrate and an insulation capping pattern covering the bit line;
an insulating spacer covering side walls of the line structure;
a conductive plug spaced apart from the bit line in a first horizontal direction with the insulating spacer therebetween; and
a conductive landing pad vertically overlapping the conductive plug,
wherein the insulating spacer comprises:
an insulating liner including a first portion contacting the line structure and a second portion contacting the conductive plug;
an outer spacer contacting the conductive plug and the conductive landing pad; and
a barrier layer including a first portion between the insulating liner and the outer spacer to prevent oxygen atoms from diffusing into the outer spacer, and
wherein the barrier layer further includes a second portion which contacts a bottom surface of the outer spacer.

9. The integrated circuit device of claim 8, wherein the barrier layer includes a two-dimensional material having a band gap of at least 1.3 eV, and
wherein the barrier layer is between the bit line and the conductive plug and between the insulation capping pattern and the conductive landing pad.

10. The integrated circuit device of claim 8, wherein the two dimensional material of the barrier layer includes SiC, SiCN, or BN, and
wherein the barrier layer is between the bit line and the conductive plug and between the insulation capping pattern and the conductive landing pad.

11. The integrated circuit device of claim 8, wherein the insulating spacer further comprises an air spacer, and
wherein the insulating liner is spaced apart from the first portion of the barrier layer with the air spacer therebetween.

12. The integrated circuit device of claim 8, wherein the barrier layer includes a monomolecular layer of a two-dimensional material selected from among h-BN, GaS, GaSe, phosphorene, $WS_2$, $WSe_2$, $MoS_2$, $MoSe_2$, $ReS_2$, and $ReSe_2$.

13. The integrated circuit device of claim 8, wherein the barrier layer includes a plurality of monomolecular layers of a two-dimensional material selected from among h-BN, GaS, GaSe, phosphorene, $WS_2$, $WSe_2$, $MoS_2$, $MoSe_2$, $ReS_2$, and $ReSe_2$.

14. The integrated circuit device of claim 8, wherein the insulating liner includes a silicon nitride layer, and
wherein the outer spacer includes a silicon nitride layer doped with dopants of oxygen atoms (O), carbon atoms (C), or a combination of the above atoms.

15. An integrated circuit device comprising:
a line structure including a bit line formed on a substrate and an insulation capping pattern that covers the bit line;
a pair of insulating spacers covering opposite side walls of the line structure, respectively; and
a pair of conductive plugs spaced apart from each other in a first horizontal direction with the line structure and the pair of insulating spacers therebetween,
wherein each of the pair of insulating spacers comprises:
an insulating liner contacting the bit line;
an outer spacer contacting one of the pair of conductive plugs;
an outer barrier layer including a first portion between the insulating liner and the outer spacer to prevent oxygen atoms from diffusing into the outer spacer; and
an air spacer between the insulating liner and the outer barrier layer, and
wherein the outer barrier layer further includes a second portion which contacts a bottom surface of the outer spacer.

16. The integrated circuit device of claim 15, wherein the insulating liner includes a silicon nitride layer,
wherein the outer spacer includes a silicon nitride layer doped with dopants of oxygen atoms (O), carbon atoms (C), or a combination of the above atoms, and
wherein the outer barrier layer includes a two-dimensional material having a band gap of at least 1.3 eV.

17. The integrated circuit device of claim 15, wherein the insulating liner includes a silicon nitride layer,
wherein the outer spacer includes a silicon nitride layer doped with dopants of oxygen atoms (O), carbon atoms (C), or a combination of the above atoms, and
wherein the outer barrier layer includes SiC, SiCN, or BN.

18. The integrated circuit device of claim 15, wherein the outer barrier layer includes a two-dimensional material selected from among h-BN, GaS, GaSe, phosphorene, $WS_2$, $WSe_2$, $MoS_2$, $MoSe_2$, $ReS_2$, and $ReSe_2$.

19. The integrated circuit device of claim 15, wherein the outer barrier layer has a thickness between 3 Å and 10 Å in the first horizontal direction.

20. The integrated circuit device of claim 15, wherein each of the pair of insulating spacers further comprises an inner barrier layer including the same material as the outer barrier layer,
the inner barrier layer contacts the insulating liner, and
the air spacer is between the inner barrier layer and the outer barrier layer.

* * * * *